United States Patent
Xie et al.

(10) Patent No.: US 11,769,772 B2
(45) Date of Patent: Sep. 26, 2023

(54) INTEGRATED CIRCUIT WITH ACTIVE REGION JOGS

(71) Applicants: TAIWAN SEMICONDUCTOR MANUFACTURING CO., LTD., Hsinchu (TW); TSMC NANJING COMPANY LIMITED, Nanjing (CN); TSMC CHINA COMPANY LIMITED, Shanghai (CN)

(72) Inventors: Tian-Yu Xie, Shanghai (CN); Xin-Yong Wang, Shanghai (CN); Lei Pan, Shanghai (CN); Kuo-Ji Chen, New Taipei (TW)

(73) Assignees: TAIWAN SEMICONDUCTOR MANUFACTURING CO., LTD., Hsinchu (TW); TSMC NANJING COMPANY LIMITED, Nanjing (CN); TSMC CHINA COMPANY LIMITED, Shanghai (CN)

( * ) Notice: Subject to any disclaimer, the term of this patent is extended or adjusted under 35 U.S.C. 154(b) by 0 days.

(21) Appl. No.: 17/586,285

(22) Filed: Jan. 27, 2022

(65) Prior Publication Data
US 2022/0149077 A1    May 12, 2022

Related U.S. Application Data

(63) Continuation of application No. 17/071,845, filed on Oct. 15, 2020, now Pat. No. 11,239,255.

(30) Foreign Application Priority Data

Aug. 31, 2020    (CN) .......................... 202010898013.0

(51) Int. Cl.
*H01L 27/12* (2006.01)
*H01L 21/84* (2006.01)
(Continued)

(52) U.S. Cl.
CPC .... *H01L 27/1203* (2013.01); *H01L 21/76283* (2013.01); *H01L 21/84* (2013.01); *H01L 29/78* (2013.01)

(58) Field of Classification Search
CPC .......... H01L 27/1203; H01L 21/78283; H01L 21/84; H01L 27/12; H01L 21/762; H01L 29/78
(Continued)

(56) References Cited

U.S. PATENT DOCUMENTS

2007/0004147 A1    1/2007  Toubou et al.
2010/0148235 A1    6/2010  Toubou et al.
(Continued)

FOREIGN PATENT DOCUMENTS

TW          202017176 A     5/2020

*Primary Examiner* — Thinh T Nguyen
(74) *Attorney, Agent, or Firm* — Maschoff Brennan

(57) ABSTRACT

An IC structure includes first and second gates, first and second source/drain regions, and an isolation region. The first and second gates each have a first portion extending along a first direction and a second portion extending along a second direction. The first source/drain regions are respectively on opposite sides of the first portion of the first gate. The second source/drain regions are respectively on opposite sides of the first portion of the second gate. The isolation region has a lower portion between a first one of the first source/drain regions and a first one of the second source/drain regions, and an upper portion partially overlapping with the second portion of first gate and the second portion of the second gate. A width of the lower portion is a less than a width of the upper portion.

20 Claims, 18 Drawing Sheets

(51) Int. Cl.
*H01L 21/762* (2006.01)
*H01L 29/78* (2006.01)

(58) Field of Classification Search
USPC .......................... 257/347; 438/149, 479, 517
See application file for complete search history.

(56) References Cited

U.S. PATENT DOCUMENTS

| | | |
|---|---|---|
| 2014/0077270 A1 | 3/2014 | Lu et al. |
| 2014/0138750 A1* | 5/2014 | Wu et al. ................ H01L 29/78 257/288 |
| 2020/0135851 A1 | 4/2020 | Lin et al. |

* cited by examiner

INTEGRATED CIRCUIT WITH ACTIVE REGION JOGS

PRIORITY CLAIM AND CROSS-REFERENCE

This application is a continuation of U.S. patent application Ser. No. 17/071,845, filed Oct. 15, 2020, now U.S. Pat. No. 11,239,255, issued on Feb. 1, 2022, which claims priority to China Application Serial Number 202010898013.0, filed Aug. 31, 2020, all of which are herein incorporated by reference in their entirety.

BACKGROUND

Semiconductor-on-insulator (SOI) technology has been utilized in the fabrication and production of semiconductor devices. SOI technology deals with the formation of transistors in a relatively thin monocrystalline semiconductor layer, which overlays an insulating layer. In other words, the active devices are formed in a thin semiconductor on an insulator layer rather than in the bulk semiconductor of the device. SOI technology makes possible certain performance advantages, such as the reduction of parasitic elements present in integrated circuits formed in bulk semiconductors, useful in high performance and high-density integrated circuits. SOI technology further allows for the mapping of standard advanced technologies into a SOI technology without significant modifications, and exhibits its advantages for higher speed, lower power consumption and better radiation immunity due to the enhanced isolation of buried oxide layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
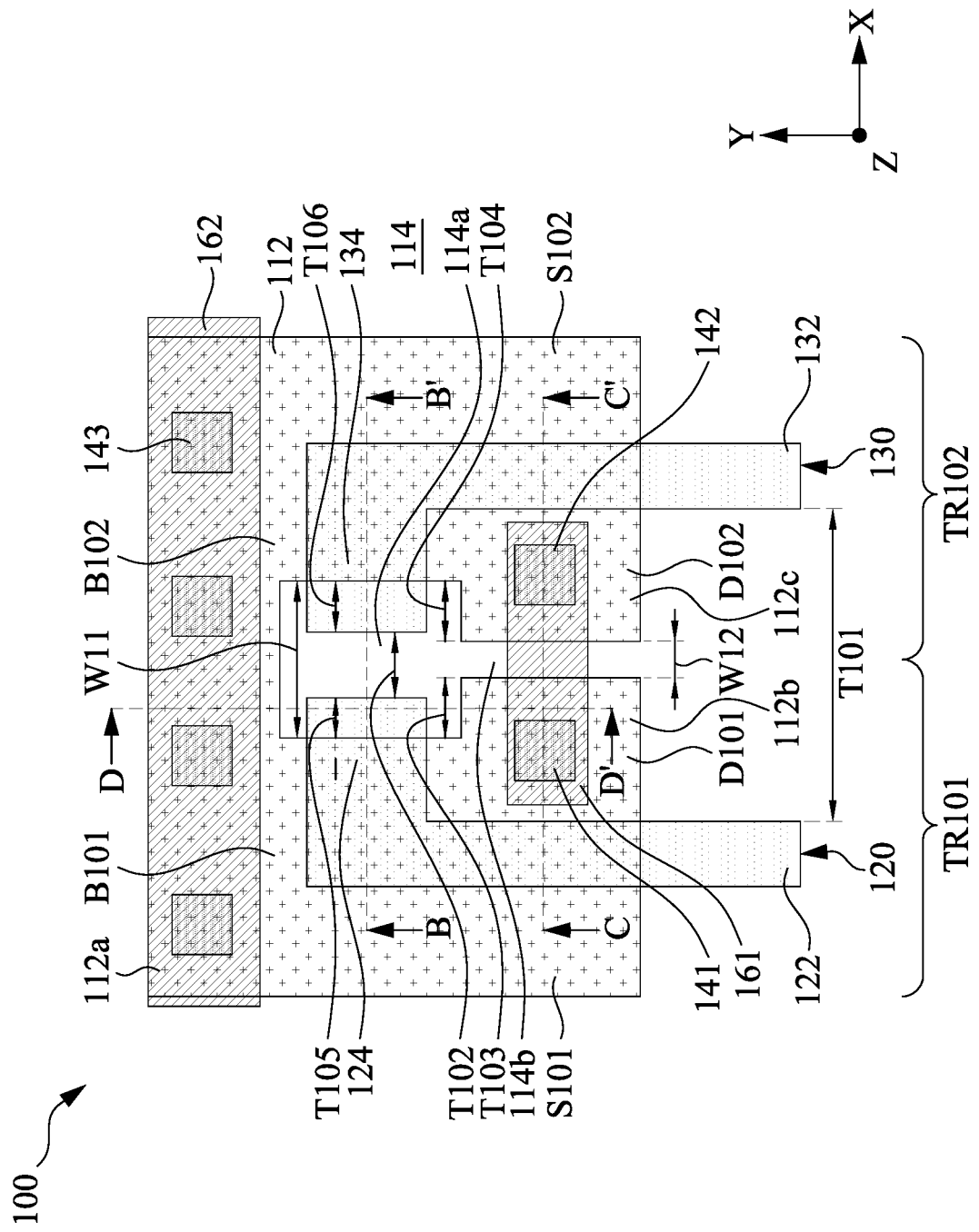
FIG. 1A illustrates a top view of an exemplary integrated circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
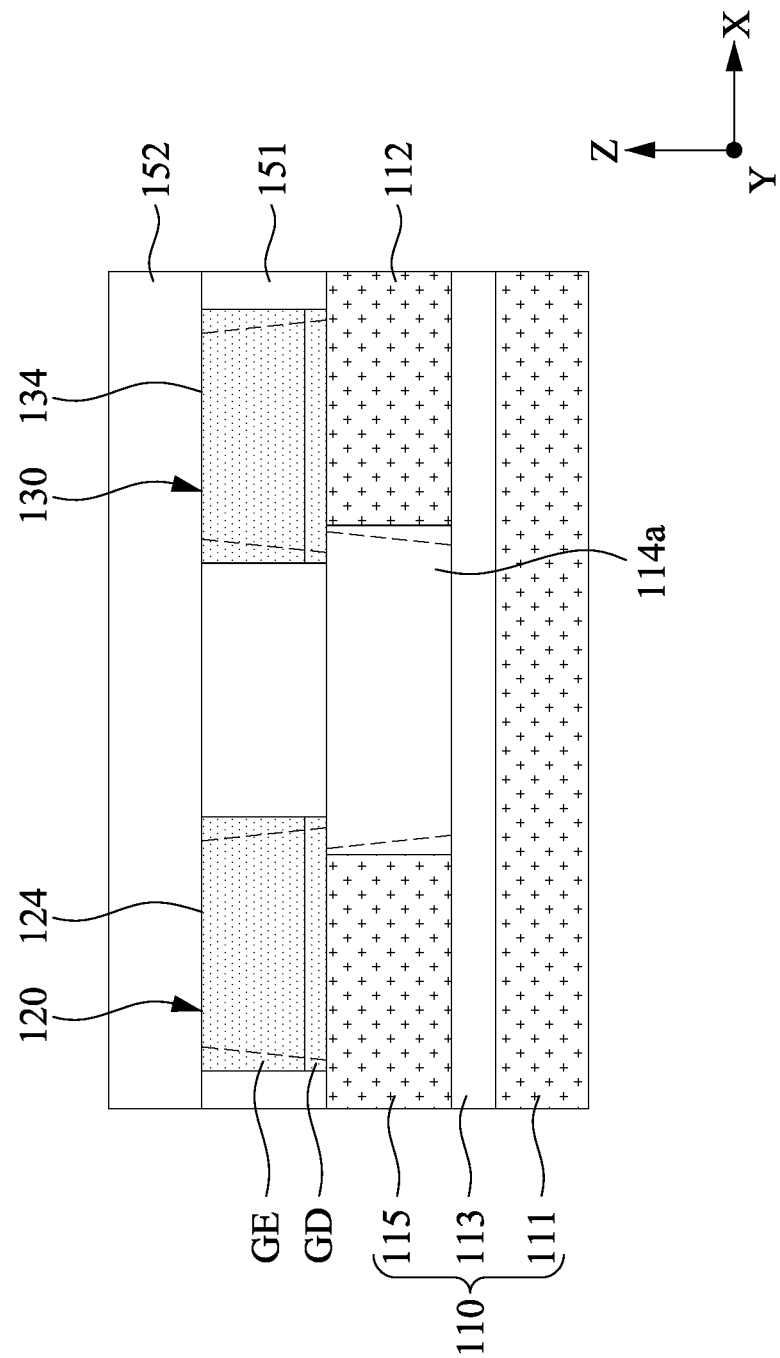
FIG. 1B is a cross-sectional view of the integrated circuit taken along B-B' line in FIG. 1A.
Figure 1C:
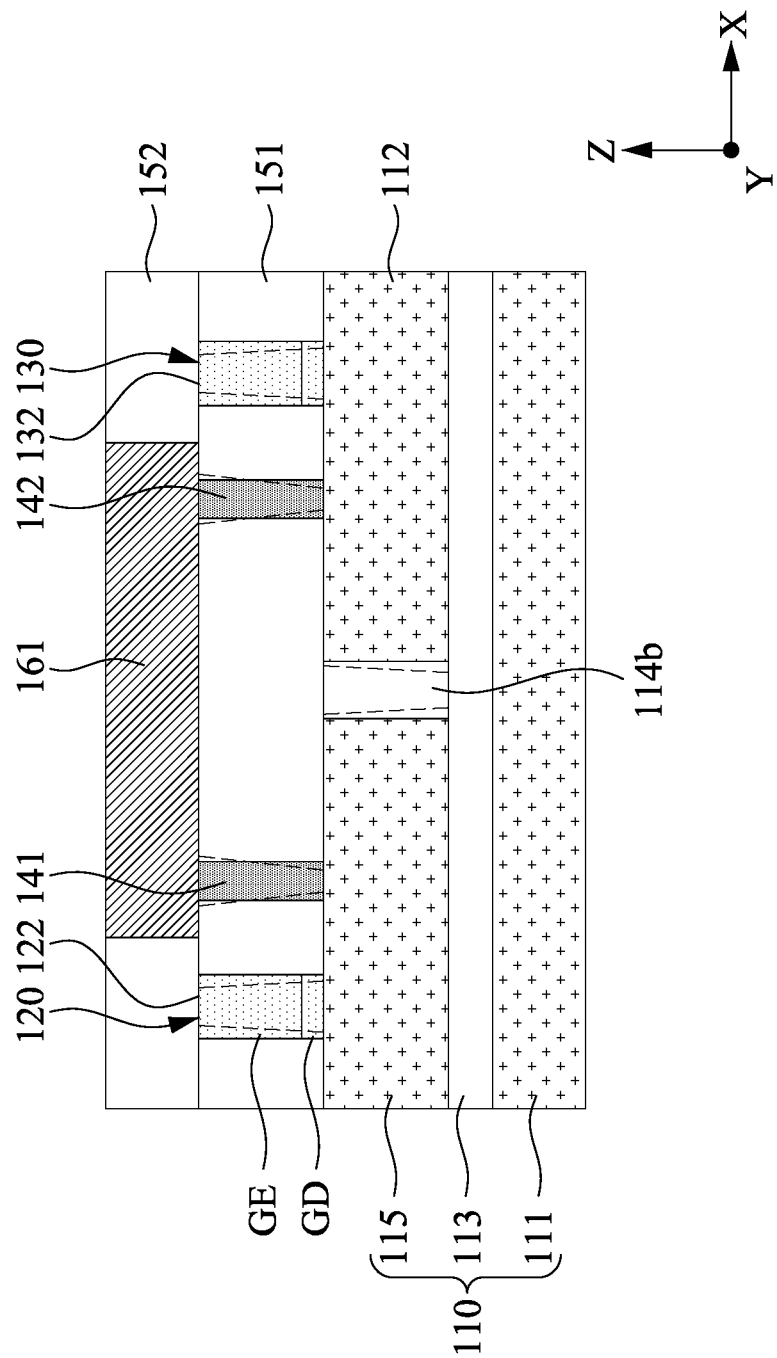
FIG. 1C is a cross-sectional view of the integrated circuit taken along C-C' line in FIG. 1A.
Figure 1D:
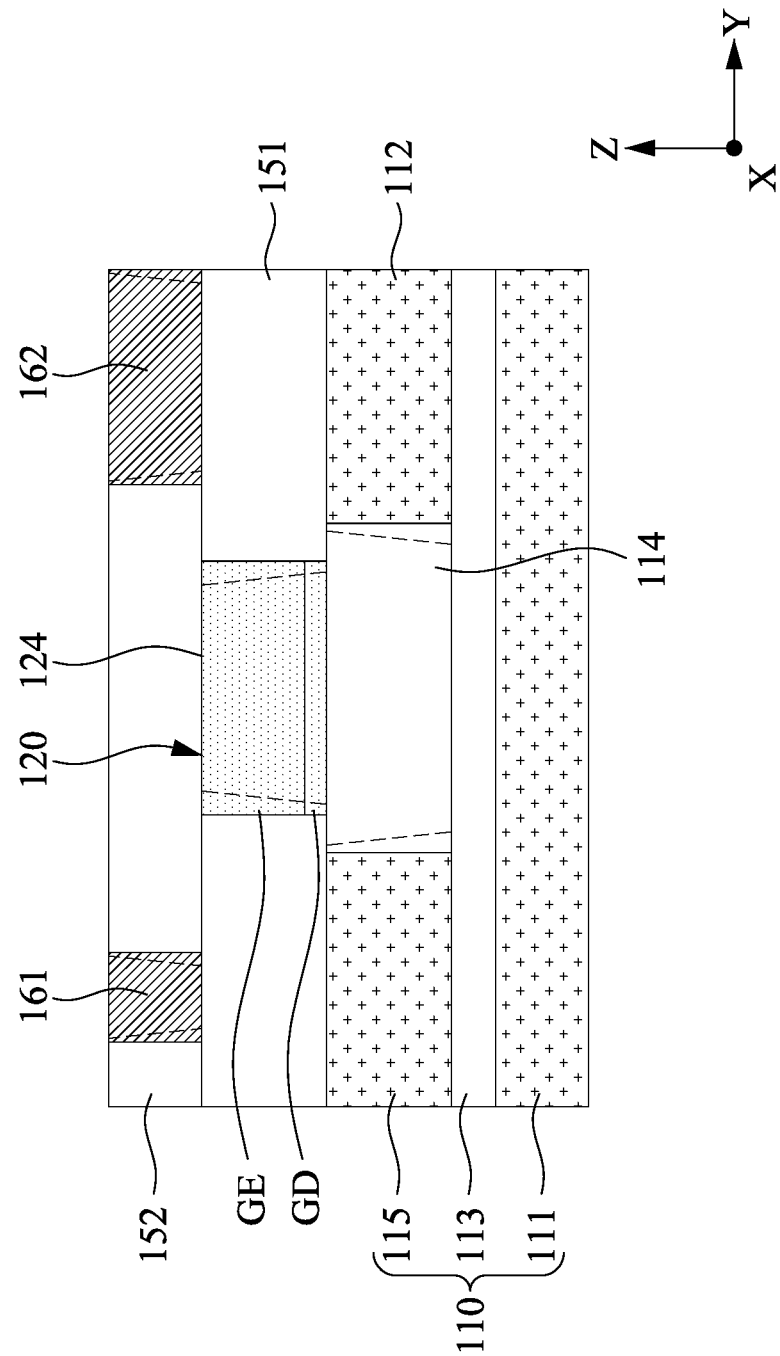
FIG. 1D is a cross-sectional view of the integrated circuit taken along D-D' line in FIG. 1A.

In some embodiments of the present disclosure, an integrated circuit formed from SOI MOSFET devices with additional active region extensions is illustrated. The active region extensions allow for reducing intrinsic gate-to-gate distances while keeping extrinsic gate-to-gate distance large enough to avoid design rule check (DRC) violation in an IC design flow. FIG. 1A illustrates a top view of an exemplary integrated circuit 100 in accordance with some embodiments of the present disclosure. FIG. 1B is a cross-sectional view of the integrated circuit 100 taken along B-B' line in FIG. 1A, FIG. 1C is a cross-sectional view of the integrated circuit 100 taken along C-C' line in FIG. 1A, and FIG. 1D is a cross-sectional view of the integrated circuit 100 taken along D-D' line in FIG. 1A.

The integrated circuit 100 includes an SOI substrate 110 provided with an active region 112 defined by an isolation region 114. The SOI substrate 110 is comprised of a base substrate 111, a buried insulator layer 113 and a semiconductor layer 115. The base substrate 111 may comprise silicon, gallium arsenide, gallium nitride, strained silicon, silicon germanium, silicon carbide, carbide, diamond, an epitaxy layer, and/or other materials. The buried insulator layer 113 may comprise silicon oxide, silicon nitride, silicon oxynitride, and/or other dielectric materials. The semiconductor layer 115 may comprise silicon, gallium arsenide, gallium nitride, strained silicon, silicon germanium, silicon carbide, carbide, diamond, and/or other materials. The buried insulator layer 113 and the semiconductor layer 115 may be formed using various SOI technologies. For example, the buried insulator layer 113 may be formed on a semiconductor wafer by a process referred to as separation by implanted oxygen (SIMOX). The SIMOX technology is based on ion-implanting a high-dose of oxygen ions into a silicon wafer, such that the peak concentration lies beneath the silicon surface. After implantation the wafer is subjected to a high-temperature anneal to form a continuous stoichiometric subsurface-layer of silicon dioxide. Thus formed dielectric layer 113, also referred to as buried oxide (BOX), electrically separates the semiconductor layer 115 and the base substrate 111. After the SOI process, one or more isolation regions, such as one or more shallow trench isolation (STI) regions 114, may be formed in the semiconductor layer 115 for defining element-to-element active regions 112.

Formation of the STI regions 114 includes patterning the semiconductor layer 115 to form trenches in the semiconductor layer 115 by using suitable photolithography and etching techniques, depositing one or more dielectric materials (e.g., silicon oxide) to completely fill the trenches in the semiconductor layer 115, followed by a planarization process (e.g., chemical mechanical polish (CMP) process) to level the STI regions 114 with the active regions 112. The dielectric materials of the STI regions 114 may be deposited using a high density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed, especially when the STI regions 114 are formed using flowable CVD. Although the cross-sections of the isolation region 114 illustrated in FIGS. 1B-1D have vertical sidewalls, they may have tapered sidewalls, as indicated by the dash lines in the isolation region 114 as illustrated in FIGS. 1B-1D.

Gate structures 120 and 130 are then formed on active region 112 through advances in deposition, lithography and masking techniques and dry etching processes. The gate structures 120 and 130 each include a gate dielectric layer GD and a gate electrode layer GE. The active region 112 may include one or more gate structures separated from each other with an appropriate minimal distance allowed by a predetermined design rule. In some embodiments, the gate dielectric layer GD is a silicon oxide layer with a thickness chosen specifically for the scaling requirements of the SOI MOSFET device technology, for example, formed through a thermal oxidation process or a chemical vapor deposition (CVD) process. It is to be appreciated other suitable gate dielectric materials such as oxides, nitrides, and combinations thereof. In some embodiments, the gate electrode layer GE is a polysilicon layer with a gate length chosen specifically for the scaling requirements of the SOI MOSFET device technology, for example deposited through Low Pressure CVD (LPCVD) methods, CVD methods and Physical Vapor Deposition (PVD) sputtering methods employing suitable silicon source materials. If desired the polysilicon layer may be ion implanted to the desired conductive type. It is to be appreciated other suitable gate electrode materials such as metal, metal alloys, single crystalline silicon, or any combinations thereof. Although the cross-sections of the gate structures 120, 130 illustrated in FIGS. 1B-1D have vertical sidewalls, they may have tapered sidewalls, as indicated by the dash lines in the gate structures 120, 130 as illustrated in FIGS. 1B-1D. Moreover, in some embodiments where the gate structures 120, 130 have tapered sidewalls, the gate structures 120, 130 taper in a direction away from the substrate 110, and on the contrary, the STI region 114 tapers in a direction toward the substrate 110.

As illustrated in FIG. 1A, the gate structure 120 is an L-shaped polysilicon gate from top view, thus creating three distinct regions including a source region S101, a drain region D101 and a body contact region B101 in the semiconductor layer 115. Similarly, the gate structure 130 is an L-shaped polysilicon gate from top view, thus creating three distinct regions including a source region S102, a drain region D102 and a body contact region B102 in the semiconductor layer 115. In some embodiments, the body contact regions B101 and B102 are parts of a continuously extending body contact region in the semiconductor layer 115.

The source regions S101, S102, drain regions D101, D102, and body contact regions B101, B102 are formed, by way of example and not limitation, ion implantation processes performed with various dopant species into the semiconductor layer 115. For an example of NFETs (e.g., N-type SOI transistors in this case), the source regions S101, S102 and the drain regions D101 and D102 are N-type doped regions with an N-type impurity (e.g., phosphorous), and body contact regions B101 and B102 are parts of a continuous doped P-type doped region having a P-type impurity (e.g., boron). On the contrary, for an example of PFETs, the source regions S101, S102 and the drain regions D101 and D102 are P-type doped regions with a P-type impurity, and body contact regions B101 and B102 are parts of a continuous doped N-type doped region having an N-type impurity. In some embodiments, the dopant (i.e., implanted impurity) for the body contact regions B101 and B102 is of the same conductivity type as the body (i.e., regions of the semiconductor layer 115 underlying the gate structures 120 and 130), and has a dopant concentration (i.e., impurity concentration) greater than that of the body. For an example of NFETs, the body contact regions B101 and B102 have a higher P-type impurity concentration than the P-type body regions in the semiconductor layer 115. For an example of PFETs, the body contact regions B101 and B102 have a higher N-type impurity concentration than the N-type body regions in the semiconductor layer 115.

As illustrated in FIG. 1A, the gate structure 120 has a first portion 122 extending along a Y-direction and a second portion 124 extending from the first portion 122 toward the gate structure 130 along an X-direction perpendicular to the Y-direction. The first portion 122 extends between the source region S101 and the drain region D101, thus acting as a transistor gate capable of forming a transistor channel in the semiconductor layer 115 and between the source region S101 and the drain region D101. Therefore, the first portion 122 is referred to as an intrinsic gate in some embodiments of the present disclosure. The second portion 124 extends between the drain region D101 and the body contact region B101 and thus would not form a transistor channel in the semiconductor layer 115. Therefore, the second portion 124 can be referred to as an extrinsic gate or gate extension in some embodiments of the present disclosure. The intrinsic gate 122 and its underlying active region 112 form an SOI transistor TR101 with the source region S101 and the drain region D101.

Similar to the gate structure 120, the gate structure 130 has a first portion 132 extending along a Y-direction and a second portion 134 extending from the first portion 132 toward the gate structure 120 along the X-direction. The first portion 132 extends between the source region S102 and the drain region D102, thus acting as an intrinsic gate capable of forming a transistor channel in the semiconductor layer 115 and between the source region S102 and the drain region D102. The second portion 134 extends between the drain region D102 and the body contact region B102 and thus would not form a transistor channel in the semiconductor layer 115. Therefore, the second portion 134 can be referred to as an extrinsic gate or gate extension in some embodiments. The intrinsic gate 132 and its underlying active region 112 form an SOI transistor TR102 with the source region S102 and the drain region D102. The drain region D101 is electrically connected to the drain region D102 (e.g., by using drain contacts and a metal line in a next level above the drain contacts, which will be described in greater detail below), thus allows for drain-to-drain connection between the SOI transistors TR101 and TR102.

As illustrated in the top view of FIG. 1A, the isolation region 114 includes a first STI portion 114a between the extrinsic gates 124, 134 and a second STI portion 114b between the drain regions D101, D102. The first STI portion 114a has a first STI width W11 measured in the X-direction greater than a second STI width W12 of the second portion 114b in the X-direction. The STI width difference results in the active region 112 having a main portion 112a having a reversed U-shape from top view, and first, second extensions (interchangeably referred to as jogs) 112b, 112c protruding from opposite sides of the main portion 112a toward each other. A part of the drain region D101 is formed in the first extension 112b (i.e., n-type or p-type impurity is doped in the extension 112b to serve as a part of drain region), and thus the first extension 112b can be interchangeably referred to as drain extension in the present disclosure. Similarly, a part of the drain region D102 is formed in the second extension 112c, and thus the second extension 112c can be interchangeably referred to as drain extension in the present disclosure.

The extensions (or jogs) 112b and 112c helps in reducing intrinsic gate-to-gate distance T101 between the intrinsic gates 122 and 132 while keeping the drain regions D101 and D102 large enough to comply with a predetermined design rule. Moreover, the wider STI portion 114a allows for extrinsic gates 124 and 134 separated by an extrinsic gate-to-gate distance T102 large enough to comply with a predetermined design rule while keeping the extrinsic gates 124 and 134 extending past opposite boundaries of the wider STI region 114a (i.e., leftmost and rightmost boundaries of the wider STI region 114a from the top view as illustrated in FIG. 1A). In this way, the intrinsic gate-to-gate distance T101 can be reduced while keeping the extrinsic gate-to-gate distance T102 large enough to prevent from design rule check (DRC) violation in an integrated circuit (IC) design flow.

In some embodiments, a ratio of the second STI width W12 to the first STI width W11 is in a range from about 1:5 to about 1:1. In some embodiments, the first STI width W11 is in a range from about 0.5 um to about 1 um, and the second STI width W12 is in a range from about 0.2 um to about 0.5 um. In some embodiments, the jog 112b protrudes from a leftmost boundary of the first STI portion 114a along the X-direction away from the left-side intrinsic gate 122 by a non-zero distance T103, which is in a range from about 0.1 um to about 0.5 um. The jog 112c protrudes from a rightmost boundary of the first STI portion 114a along the X-direction away from the right-side intrinsic gate 132 by a non-zero distance T104, which is in a range from about 0.1 um to about 0.5 um. In certain embodiments, the term "about" used in this context means greater or less than the stated value or the stated range of values by a percentage such as 5%, 10%, 15%, etc. of the stated values.

The extrinsic gate 124 extends past the leftmost boundary of the first STI portion 114a by a non-zero distance T105, which in turn allows for separating the drain region D101 from the body contact region B101. The extrinsic gate 134 extends past the rightmost boundary of the first STI portion 114a by a non-zero distance T106, which in turn allows for separating the drain region D102 from the body contact region B102. In some embodiments, the non-zero distance T105 and/or the non-zero distance T106 are in a range from about 0.1 um to about 0.2 um.

The integrated circuit 100 further includes drain contacts 141 and 142 respectively overlying the drain regions D101 and D102 to provide electrical connections to the drain regions D101 and D102. Moreover, the integrated circuit 100 further includes body contacts 143 overlapping the body contact regions B101 and B102 to provide electrical connections to the body contact regions B101 and B102. In the depicted embodiment, the drain contacts 141, 142 and the body contacts 143 have a rectangular profile from top view. In some other embodiments, the drain contacts 141, 142 and the body contacts 143 have a circular or elliptical profile from top view, depending on the photolithography and etching techniques.

In some embodiments, the drain contacts 141, 142 and the body contacts 143 are formed from one or more conductive materials such as, for example, cobalt, cupper, tungsten and/or other suitable metals. Formation of the drain contacts 141, 142 and body contacts 143 includes, for example, depositing a first interlayer dielectric (ILD) layer 151 over the substrate 110 after the doping process of forming the source/drain regions and body contact regions, optionally performing a CMP process to level the first ILD layer 151 with the gate structures 120, 130, etching contact openings in the first ILD layer 151 to expose drain regions, body contact regions and source regions, depositing one or more conductive materials in the contact openings, and performing a CMP process to planarize the one or more conductive materials with the gate structures 120, 130. The remaining conductive materials in the contact openings thus serve as contacts (e.g., drain contacts 141, 142 and body contacts 143). In the exemplary contact formation process, the drain contacts 141, 142 are simultaneously formed with the body contacts 143, and thus the resulting drain contacts 141, 142 may have same material and same height as the body contacts 143. Although the cross-sections of the contacts (e.g., drain contacts 141, 142 illustrated in FIG. 1C) have vertical sidewalls, they may have tapered sidewalls, as indicated by the dash lines in the contacts 141, 142 as illustrated in FIG. 1C. Moreover, in some embodiments where the contacts have tapered sidewalls, the contacts taper in a direction toward the substrate 110, opposite to the direction in which the gate structures 120 and 130 taper.

The integrated circuit 100 further includes a plurality of metal lines 161 and 162 (interchangeably referred to as "M1" metal lines in the present disclosure) on a next level above the gate structures 120, 130 and the contacts 141-143. The M1 metal line 161 extends across the drain contacts 141 and 142 along the X-direction, and the M1 metal line 162 extends across the body contacts 143 along the X-direction. As such, the M1 metal line 162 is electrically connected to the body contact regions B101 and B102 by using the body contacts 143, and the M1 metal line 161 is electrically connected to the drain regions D101 and D102 by using the drain contacts 141 and 142. Stated differently, the drain regions D101, D102 of different SOI transistors TR101, TR102 are electrically connected using a common metal line 161, thus achieving drain-to-drain connection between the SOI transistors TR101 and TR102.

In some embodiments, the M1 metal lines 161 and 162 include a conductive material such as, for example, cobalt, cupper, tungsten and/or other suitable metals. Formation of the M1 metal lines 161 and 162 includes, by way of example and not limitation, depositing a second ILD layer 152 over the first ILD layer 151, etching trenches in the second ILD layer 152 and over the contacts 141-143, depositing one or more conductive materials in the trenches, and performing a CMP process to planarize the one or more conductive materials. The remaining conductive materials in the trenches thus serve as M1 metal lines 161 and 162. Although the cross-sections of the M1 metal lines (e.g., metal lines 161, 162 illustrated in FIGS. 1C and 1D) have vertical sidewalls, they may have tapered sidewalls in some other embodiments, as indicated by the dash lines in the M1 metal lines 161, 162 as illustrated in FIGS. 1C and 1D. Moreover, in some embodiments where the M1 metal lines have tapered sidewalls, the M1 metal lines taper in a direction toward the substrate 110, opposite to the direction in which the gate structures 120 and 130 taper.

In some embodiments, the M1 metal line 161 extends past opposing sides of the second STI portion 114b, so as to reach the drain contact 141 on the left side of the second STI portion 114b as well as the drain contact 142 on the right side of the second STI portion 114b. In some embodiments, when viewed from above the M1 metal line 162 extends past opposing outermost boundaries of the active region 112 by non-zero distances. In some embodiments, the M1 metal line 162 is a Vdd line extending across multiple active regions 112.

Figure 2A:
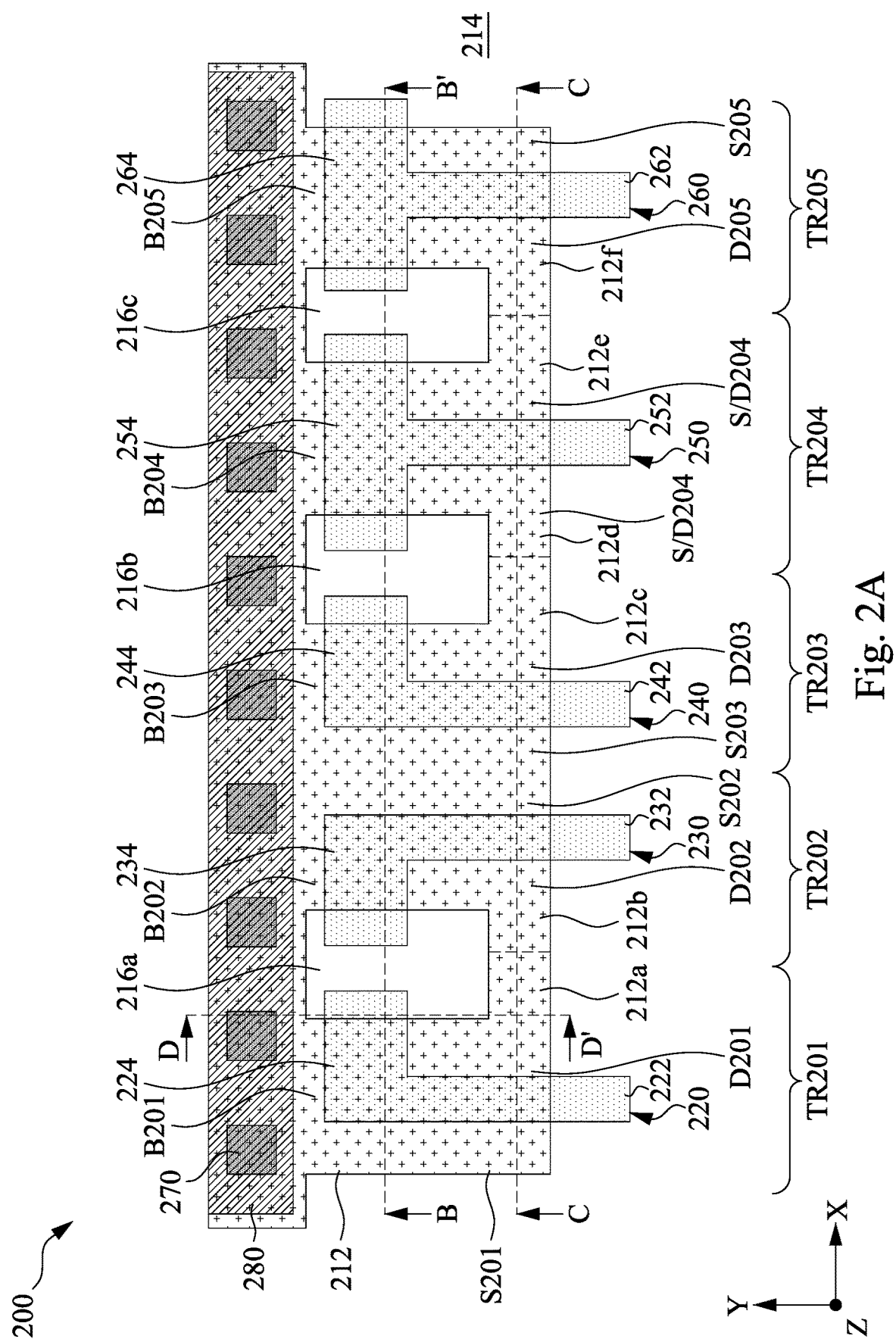
FIG. 2A illustrates a top view of an exemplary integrated circuit in accordance with some embodiments.
Figure 2B:
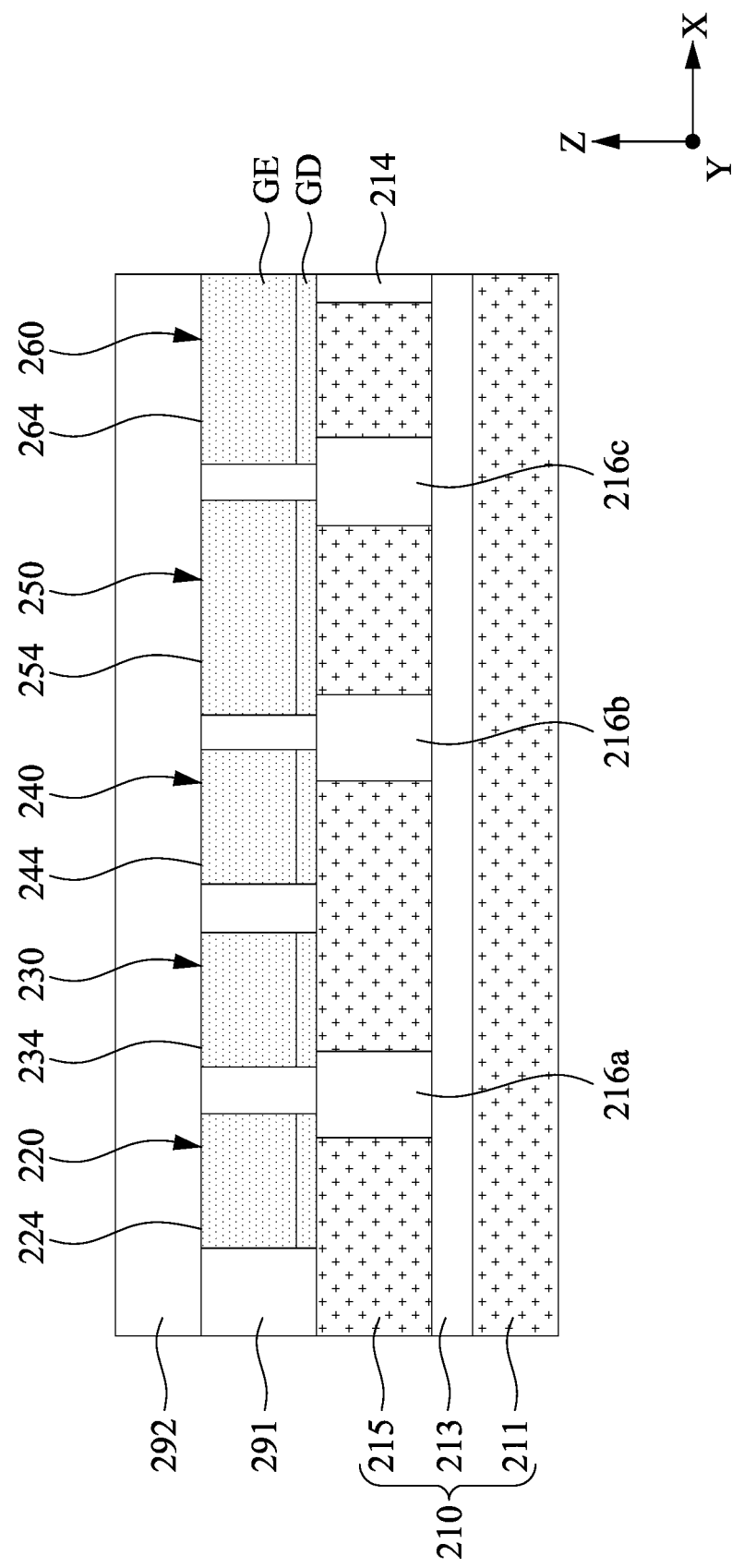
FIG. 2B is a cross-sectional view of the integrated circuit taken along B-B' line in FIG. 2A.
Figure 2C:
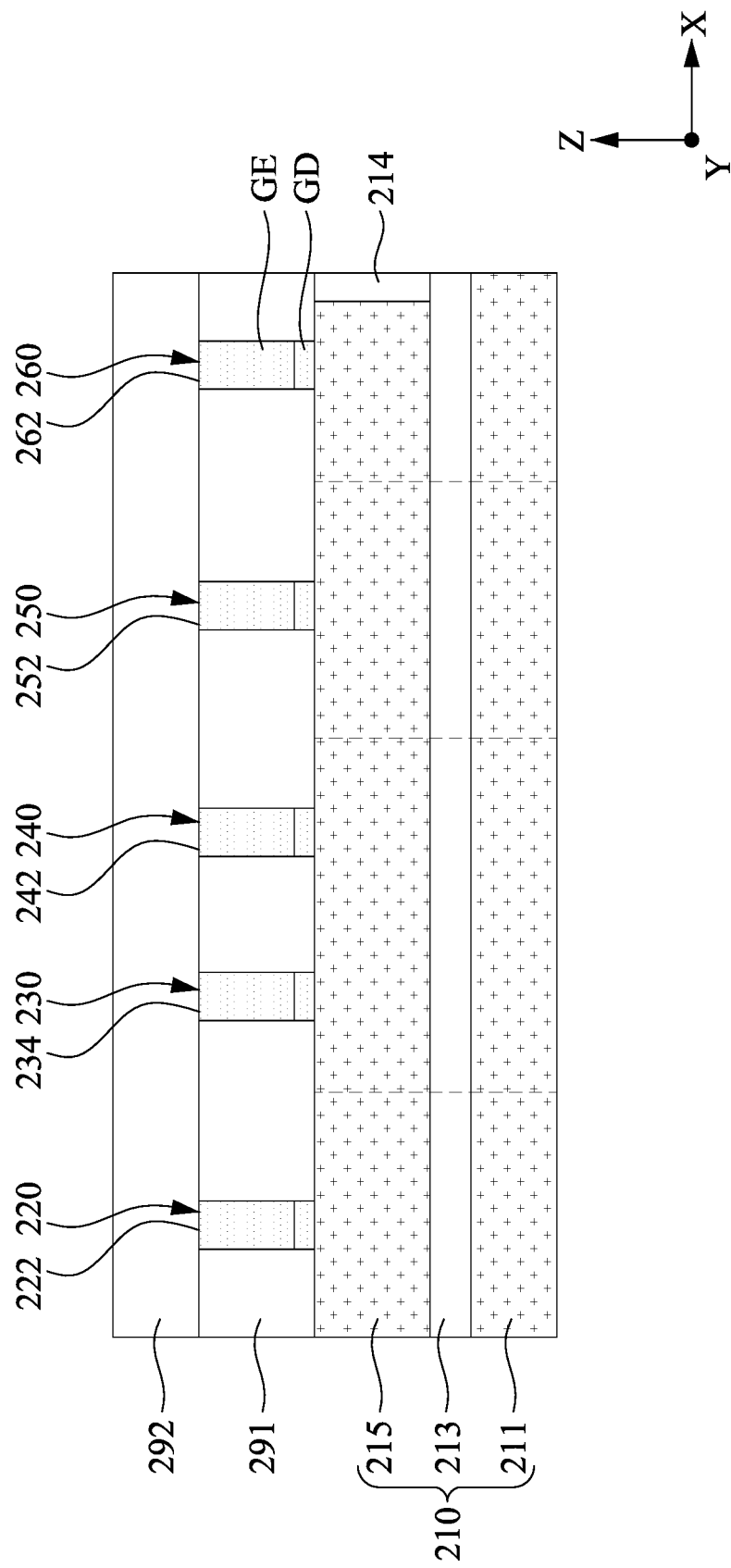
FIG. 2C is a cross-sectional view of the integrated circuit taken along C-C' line in FIG. 2A.
Figure 2D:
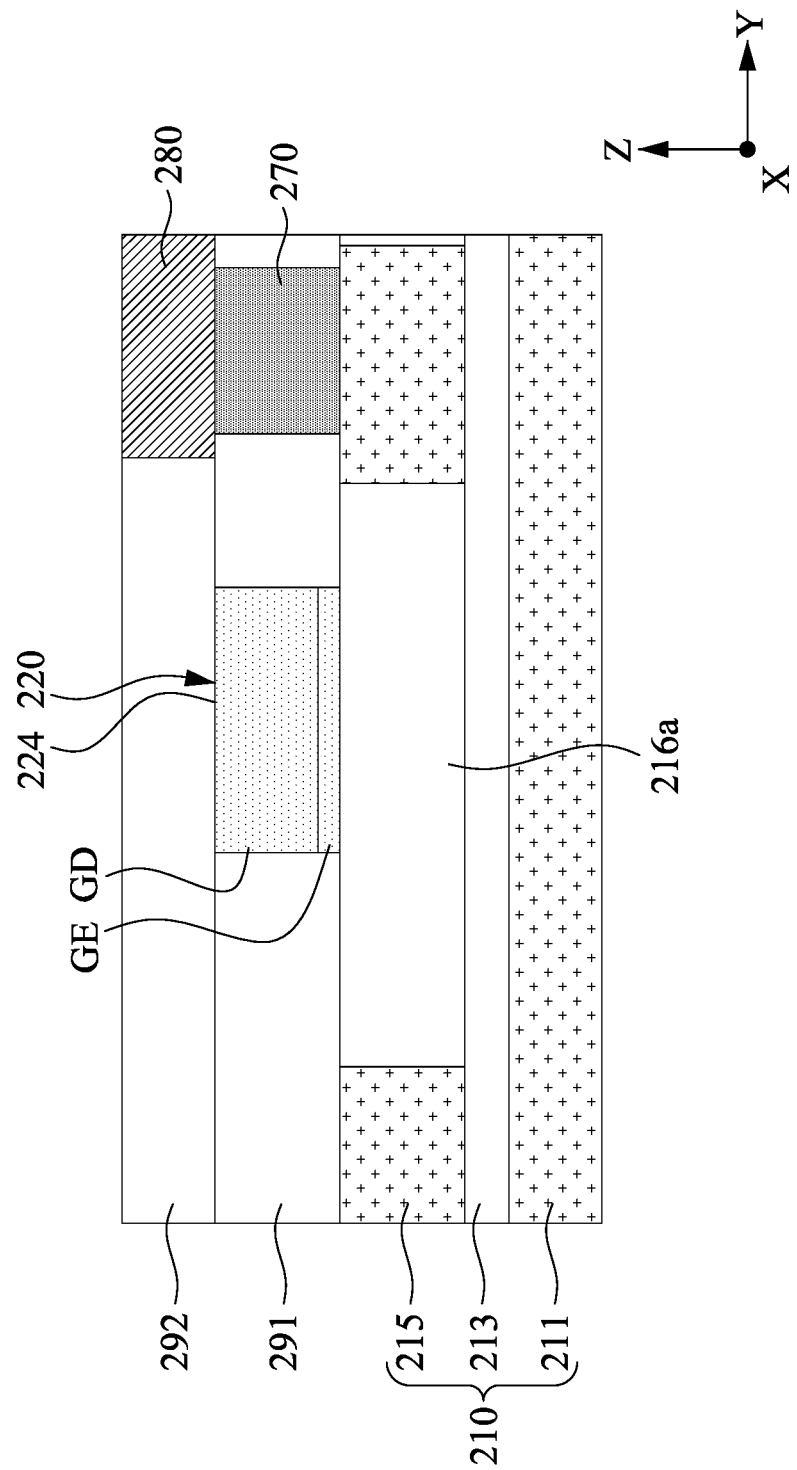
FIG. 2D is a cross-sectional view of the integrated circuit taken along D-D' line in FIG. 2A.

FIG. 2A illustrates a top view of an exemplary integrated circuit 200 in accordance with some embodiments. FIG. 2B is a cross-sectional view of the integrated circuit 200 taken along B-B' line in FIG. 2A, FIG. 2C is a cross-sectional view of the integrated circuit 200 taken along C-C' line in FIG. 2A, and FIG. 2D is a cross-sectional view of the integrated circuit 200 taken along D-D' line in FIG. 2A.

The integrated circuit 200 includes an SOI substrate 210 provided with an active region 212 defined by an outside isolation region (e.g., STI region) 214 laterally surrounding the active region 212 and a plurality of inside isolation regions (e.g., STI regions) 216a, 216b and 216c enclosed within the active region 212. The SOI substrate 210 is comprised of a base substrate 211, a buried insulator layer 213 and a semiconductor layer 215. Materials and fabrication methods of the SOI substrate 210 are similar to that of the SOI substrate 110 as discussed previously with respect to FIGS. 1A-1D and thus are not repeated for the sake of brevity.

Gate structures 220, 230, 240, 250 and 260 are formed on the active region 212 through advances in deposition, lithography and masking techniques and dry etching processes. The gate structures 220-260 each include a gate dielectric layer GD and a gate electrode layer GE. Materials and fabrication methods of the gate structures 220-260 are similar to that of the gate structures 120-130 as discussed previously with respect to FIGS. 1A-1D and thus are not repeated for the sake of brevity.

As illustrated in FIG. 2A, the gate structure 220 is an L-shaped polysilicon gate from top view, thus creating three distinct regions including a source region S201, a drain region D201 and a body contact region B201 in the semiconductor layer 115. The gate structure 220 includes an intrinsic gate 222 extending along the Y-direction between the source region S201 and the drain region D201, and an extrinsic gate 224 extending along the X-direction between the drain region D201 and the body contact region B201. The intrinsic gate 222 and its underlying active region form an SOI transistor TR201 with the source region S201 and the drain region D201. Similarly, the gate structure 230 is an L-shaped polysilicon gate next to the gate structure 220 from top view, and it creates three distinct regions including a source region S202, a drain region D202 and a body contact region B202 in the semiconductor layer 215. The gate structure 230 includes an intrinsic gate 232 extending along the Y-direction between the source region S202 and the drain region D202, and an extrinsic gate 234 extending along the X-direction between the drain region D202 and the body contact region B202. The intrinsic gate 232 and its underlying active region 212 form an SOI transistor TR202 with the source region S202 and the drain region D202.

The drain region D201 of the SOI transistor TR201 abuts the drain region D202 of the SOI transistor TR202, thus allows for drain-to-drain connection between the SOI transistors TR201 and TR202 without using drain contacts and an M1 metal line connecting the drain contacts. More specifically, the active region 212 includes an extension 212a protruding from a leftmost boundary of the inside STI region 216a toward the gate structure 230 along the X-direction by a non-zero distance, and the active region 212 further includes an extension 212b protruding from a rightmost boundary of the inside STI region 216a toward the gate structure 220 along the X-direction by a non-zero distance. The extensions 212a and 212b abut each other and thus are "merged" together to define a lower boundary of the inside STI region 216a. Stated differently, the drain regions D201 and D202 in combination act as a shared drain region continuously extending between the gate structures 220 and 230. It is understood that the dash line between the extensions 212a and 212b is only used for illustration. In practical, there may be no distinguishable interface between the extensions 212a and 212b. A part of the drain region D201 is formed in the extension 212a, and thus the extension 212a can be interchangeably referred to as drain extension in the present disclosure. Similarly, a part of the drain region D202 is formed in the extension 212b, and thus the extension 212b can be interchangeably referred to as drain extension in the present disclosure as well.

The gate structure 240 is an L-shaped polysilicon gate from top view, thus creating three distinct regions including a source region S203, a drain region D203 and a body contact region B203 in the active region 212. The gate structure 240 includes an intrinsic gate 242 extending along the Y-direction between the source region S203 and the drain region D203, and an extrinsic gate 244 extending along the X-direction between the drain region D203 and the body contact region B203. The intrinsic gate 242 and its underlying active region form an SOI transistor TR203 with the source region S203 and the drain region D203. The source region S203 of the SOI transistor TR203 abuts the source region S202 of the SOI transistor TR202. Stated differently, the source regions S202 and S203 in combination act as a shared source region continuously extending between the gate structures 230 and 240.

The gate structure 250 is a T-shaped polysilicon gate from top view, thus creating three distinct regions including source/drain regions S/D204 and a body contact region B204 in the active region 212. The gate structure 250 includes an intrinsic gate 252 extending along the Y-direction between the source/drain regions S/D204, and an extrinsic gate 254 extending along the X-direction between the source/drain regions S/D204 and the body contact region B204. The intrinsic gate 252 and its underlying active region form an SOI transistor TR204 with the source/drain regions S/D204.

One of the source/drain regions S/D204 of the SOI transistor TR204 abuts the drain region D203 of the SOI transistor TR203, thus allows for drain-to-drain connection or source-to-drain connection between the SOI transistors TR203 and TR204 without using source/drain contacts and an M1 metal line connecting the source/drain contacts. More specifically, the active region 212 includes an extension 212c protruding from a leftmost boundary of the inside STI region 216b toward the gate structure 250 along the X-direction by a non-zero distance, and the active region 212 further includes an extension 212d protruding from a rightmost boundary of the inside STI region 216b toward the gate structure 240 along the X-direction by a non-zero distance. The extensions 212c and 212d abut each other and thus are merged together to define a lower boundary of the inside STI region 216b. It is understood that the dash line between the extensions 212c and 212d is only used for illustration. In practical, there may be no distinguishable interface between the extensions 212c and 212d. A part of the drain region D203 is formed in the extension 212c, and thus the extension 212c can be interchangeably referred to as drain extension in the present disclosure. Similarly, a part of the drain region S/D204 is formed in the extension 212d, and thus the extension 212d can be interchangeably referred to as source/drain extension in the present disclosure as well.

The gate structure 260 is a T-shaped polysilicon gate from top view, thus creating three distinct regions including a drain region D205, a source region S205 and a body contact region B205 in the active region 212. The gate structure 260 includes an intrinsic gate 262 extending along the Y-direction between the source region S205 and drain region D205, and an extrinsic gate 264 extending along the X-direction between the source/drain regions S205, D205 and the body contact region B205. The intrinsic gate 262 and its underlying active region form an SOI transistor TR205 with the source region S205 and the drain region D205.

The drain region D205 of the SOI transistor TR205 abuts one of the source/drain regions S/D204 of the SOI transistor TR204, thus allows for drain-to-drain connection or source-to-drain connection between the SOI transistors TR204 and TR205 without using source/drain contacts and an M1 metal line connecting the source/drain contacts. More specifically, the active region 212 includes an extension 212e protruding from a leftmost boundary of the inside STI region 216c toward the gate structure 260 along the X-direction by a non-zero distance, and the active region 212 further includes an extension 212f protruding from a rightmost boundary of the inside STI region 216c toward the gate structure 220 along the X-direction by a non-zero distance. The extensions 212e and 212f abut each other and thus are merged together and define a lower boundary of the inside STI region 216c. It is understood that the dash line between the extensions 212e and 212f is only used for illustration. In practical, there may be no distinguishable interface between the extensions 212e and 212f. A part of the source/drain region S/D204 is formed in the extension 212e, and thus the extension 212e can be interchangeably referred to as source/drain extension in the present disclosure. Similarly, a part of the drain region D205 is formed in the extension 212f, and thus the extension 212f can be interchangeably referred to as drain extension in the present disclosure as well.

Formation and materials of the source/drain regions, body contact regions and gate structures are similar to that discussed previously with respect to FIGS. 1A-1D and thus are not repeated for the sake of brevity.

The body contact regions B201-B205 are parts of a continuously extending body contact region in the active region 212. Moreover, the integrated circuit 200 further includes a plurality of body contacts 270 overlapping the body contact regions B201-B205 to provide electrical connections to the body contact regions B201-B205. In the depicted embodiment, the body contacts 270 have a rectangular profile from top view. In some other embodiments, the body contacts 270 have a circular or elliptical profile from top view, depending on the photolithography and etching techniques. Material of the body contacts 270 is similar to that of the body contacts 143 as discussed previously with respect to FIGS. 1A-1D. Formation of the body contacts 270 includes, by way of example and not limitation, depositing a first ILD layer 291 over the substrate 210 after the doping process of forming the source/drain regions and body contact regions, optionally performing a CMP process to level the first ILD layer 291 with the gate structures 220-260, etching contact openings in the first ILD layer 291 to expose body contact regions, depositing one or more conductive materials in the contact openings, and performing a CMP process to planarize the one or more conductive materials with the gate structures 220-260. The remaining conductive materials in the contact openings thus serve as body contacts 270.

The integrated circuit 200 further includes an M1 metal line 280 on a next level above the gate structures 220-260 and body contacts 270. The M1 metal line 280 extends across the body contacts 270 along the X-direction, and thus the M1 metal line 280 is electrically connected to the body contact regions B201-B205 by using the body contacts 270. Material of the M1 metal line 280 is similar to that of the M1 metal lines 161 and 162 as discussed previously with respect to FIGS. 1A-1D and thus is not repeated for the sake of brevity. Formation of the M1 metal line 280 includes, by way of example and not limitation, depositing a second ILD layer 292 over the first ILD layer 291, etching a trench in the second ILD layer 292 and across all body contacts 270, depositing one or more conductive materials in the trench, and performing a CMP process to planarize the one or more conductive materials. The remaining conductive materials in the trench thus serve as the M1 metal line 280. In some embodiments, the M1 metal line 280 is a Vdd line extending across multiple active regions 212.

Figure 3A:
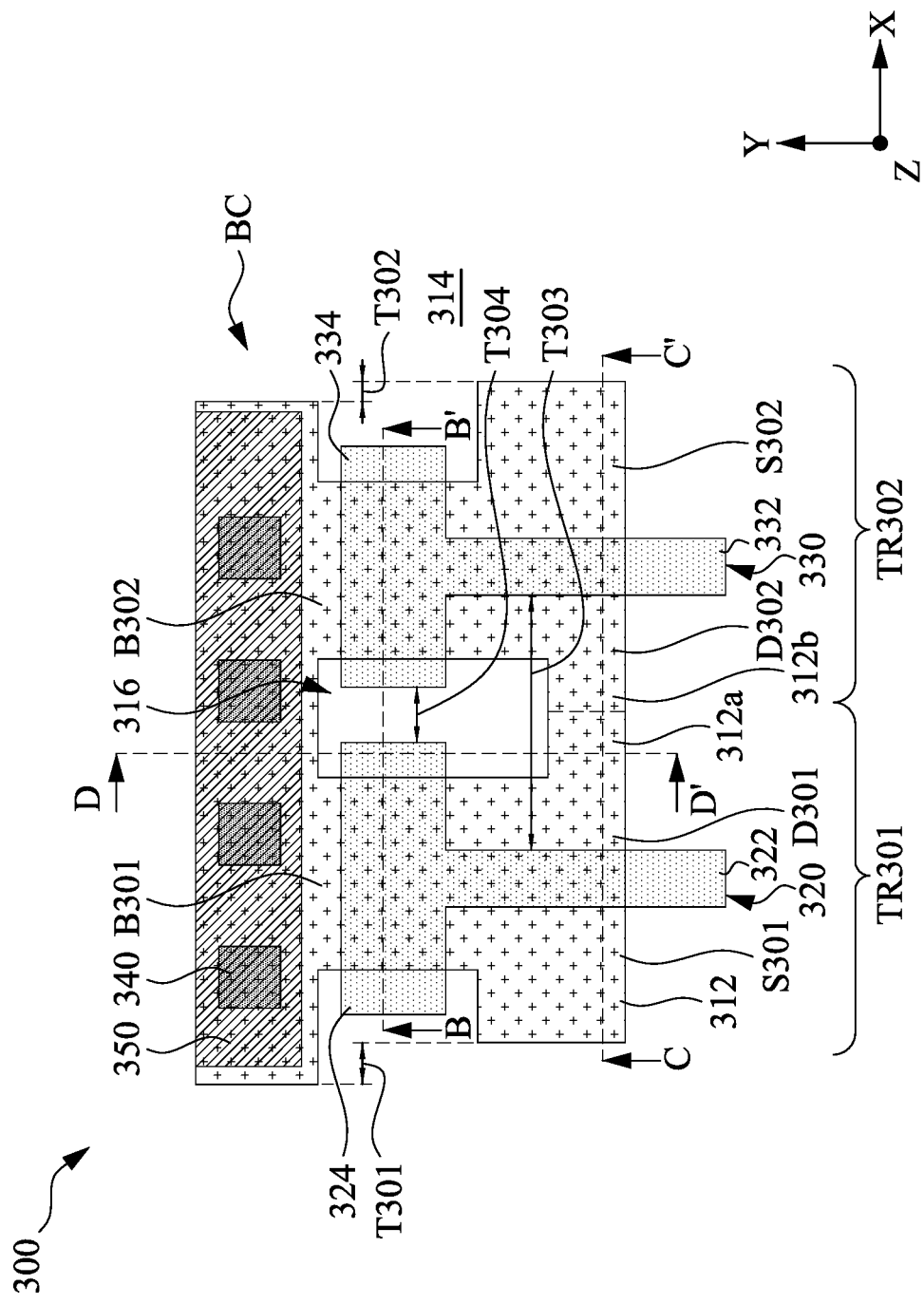
FIG. 3A illustrates a top view of an exemplary integrated circuit in accordance with some embodiments.
Figure 3B:
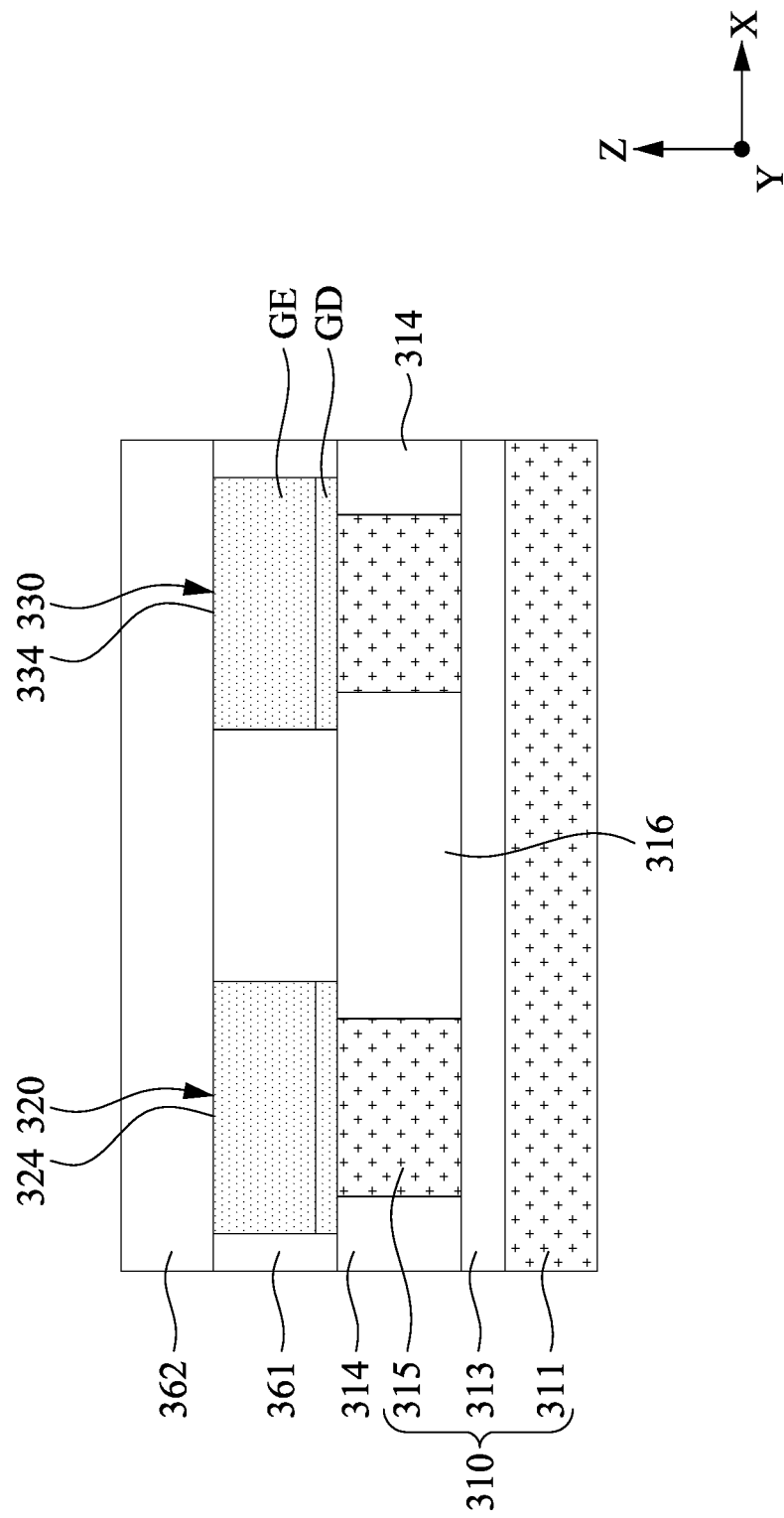
FIG. 3B is a cross-sectional view of the integrated circuit taken along B-B' line in FIG. 3A.
Figure 3C:
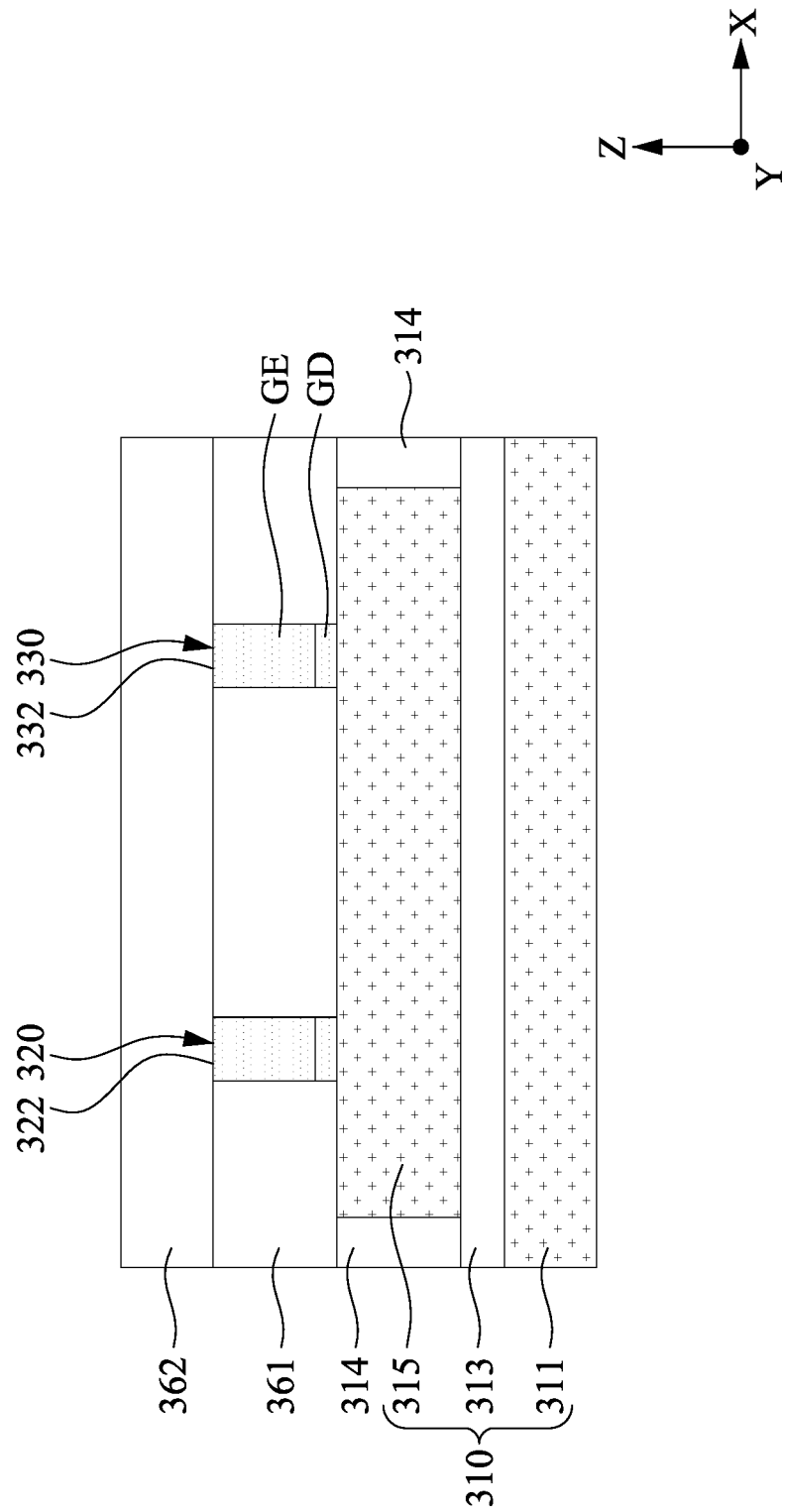
FIG. 3C is a cross-sectional view of the integrated circuit taken along C-C' line in FIG. 3A.
Figure 3D:
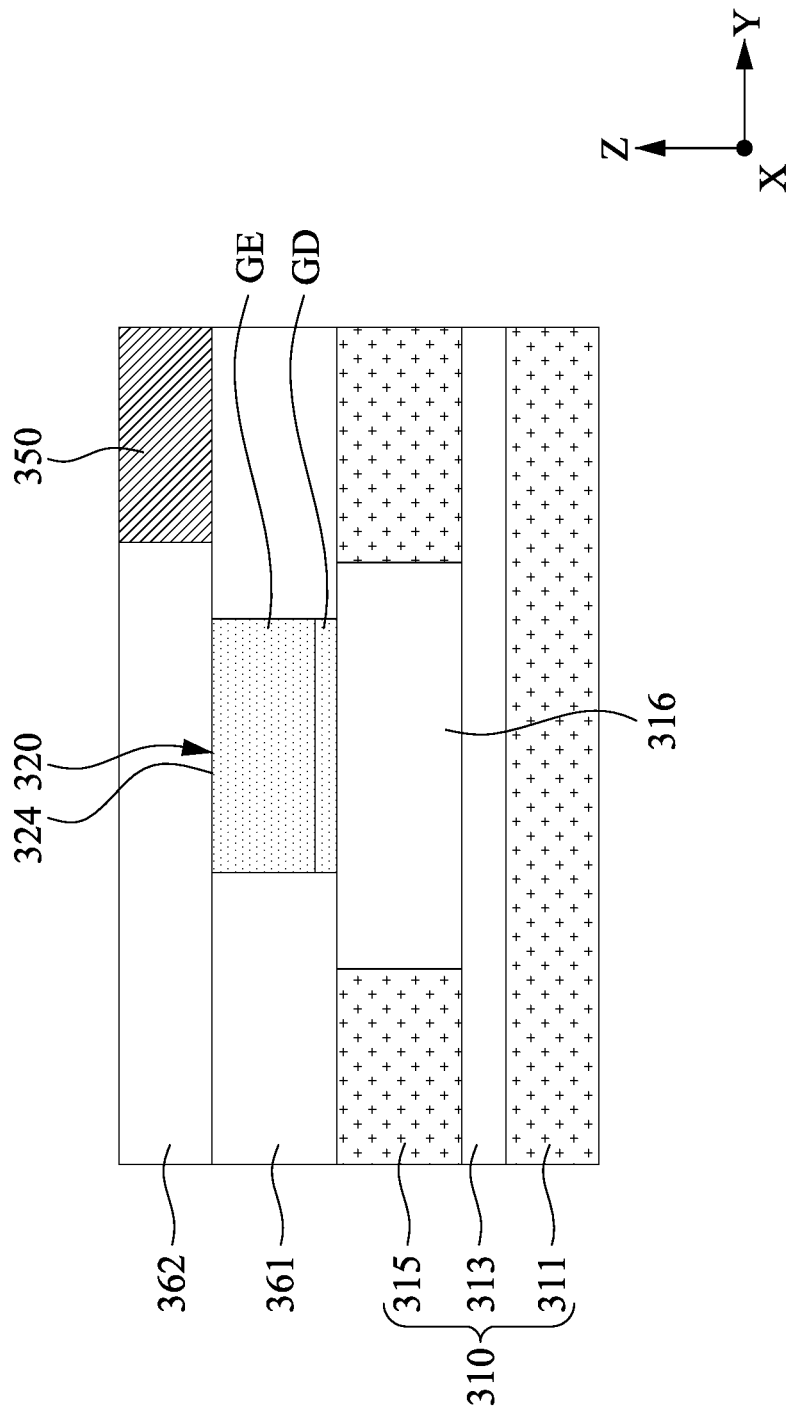
FIG. 3D is a cross-sectional view of the integrated circuit taken along D-D' line in FIG. 3A.

FIG. 3A illustrates a top view of an exemplary integrated circuit 300 in accordance with some embodiments. FIG. 3B is a cross-sectional view of the integrated circuit 300 taken along B-B' line in FIG. 3A, FIG. 3C is a cross-sectional view of the integrated circuit 300 taken along C-C' line in FIG. 3A, and FIG. 3D is a cross-sectional view of the integrated circuit 300 taken along D-D' line in FIG. 3A.

The integrated circuit 300 includes an SOI substrate 310 provided with an active region 312 defined by an outside isolation region (e.g., STI region) 314 laterally surrounding the active region 312 and an inside isolation region (e.g., STI region) 316 enclosed within the active region 312. The SOI substrate 310 is comprised of a base substrate 311, a buried insulator layer 313 and a semiconductor layer 315. Materials and fabrication methods of the SOI substrate 310 are similar to that of the SOI substrate 110 as discussed previously with respect to FIGS. 1A-1D and thus are not repeated for the sake of brevity.

Gate structures 320 and 330 are formed on the active region 312 through advances in deposition, lithography and masking techniques and dry etching processes. The gate structures 320 and 330 each include a gate dielectric layer GD and a gate electrode layer GE. Materials and fabrication methods of the gate structures 320 and 330 are similar to that of the gate structures 120-130 as discussed previously with respect to FIGS. 1A-1D and thus are not repeated for the sake of brevity.

As illustrated in FIG. 3A, the gate structure 320 is a T-shaped polysilicon gate from top view, thus creating three distinct regions including a source region S301, a drain region D301 and a body contact region B301 in the semiconductor layer 315. The gate structure 320 includes an intrinsic gate 322 extending along the Y-direction between the source region S301 and the drain region D301, and an extrinsic gate 324 extending along the X-direction between the drain region D301 and the body contact region B301. The intrinsic gate 322 and its underlying active region 312 form an SOI transistor TR301 with the source region S301 and the drain region D301. The extrinsic gate 324 laterally extends past opposite sides of the active region 312 by equal or non-equal non-zero distances.

Similarly, the gate structure 330 is also a T-shaped polysilicon gate next to the gate structure 320 from top view, and it creates three distinct regions including a source region S302, a drain region D302 and a body contact region B302 in the semiconductor layer 315. The gate structure 330 includes an intrinsic gate 332 extending along the Y-direction between the source region S302 and the drain region D302, and an extrinsic gate 334 extending along the X-direction between the drain region D302 and the body contact region B302. The intrinsic gate 332 and its underlying active region 312 form an SOI transistor TR302 with the source region S302 and the drain region D302. The extrinsic gate 334 laterally extends past opposite sides of the active region 312 by equal or non-equal non-zero distances.

The body contact regions B301 and B302 are parts of a continuously extending body contact region BC in the active region 312. Moreover, in the depicted embodiment, a leftmost boundary of the continuous body contact region BC extends further than a leftmost boundary of the source region S301 of the left-side SOI transistor TR301 by a non-zero distance T301, but a rightmost boundary of the continuous body contact region BC is set back from a rightmost boundary of the source region S302 of the right-side SOI transistor TR302 by a non-zero distance T302. In the depicted embodiment, the non-zero distance T302 is less than the non-zero distance T301. In some other embodiments, the non-zero distance T302 is greater than or equal to the non-zero distance T301.

The drain region D301 of the SOI transistor TR301 abuts the drain region D302 of the SOI transistor TR302, thus allows for drain-to-drain connection between the SOI transistors TR301 and TR302 without using drain contacts and an M1 metal line connecting the drain contacts. More specifically, the active region 312 includes an extension 312a protruding from a leftmost boundary of the inside STI region 316 toward the gate structure 330 along the X-direction by a non-zero distance, and the active region 312 further includes an extension 312b protruding from a rightmost boundary of the inside STI region 316 toward the gate structure 320 along the X-direction by a non-zero distance. The extensions 312a and 312b abut each other and thus are merged together to define a lower boundary of the inside STI region 316. Stated differently, the drain regions D301 and D302 in combination act as a shared drain region continuously extending between the gate structures 320 and 330. It is understood that the dash line between the extensions 312a and 312b is only used for illustration. In practical, there may be no distinguishable interface between the extensions 312a and 312b. A part of the drain region D301 is formed in the extension 312a, and thus the extension 312a can be interchangeably referred to as drain extension in the present disclosure. Similarly, a part of the drain region D302 is formed in the extension 312b, and thus the extension 312b can be interchangeably referred to as drain extension in the present disclosure as well.

Formation and materials of the source regions S301, S302, drain regions D301,D302, body contact regions B301, B302, and gate structures 320, 330 are similar to that discussed previously with respect to FIGS. 1A-1D and thus are not repeated for the sake of brevity.

The integrated circuit 300 further includes body contacts 340 overlapping the body contact regions B301 and B302 to provide electrical connections to the body contact regions B301 and B305. In the depicted embodiment, the body contacts 340 have a rectangular profile from top view. In some other embodiments, the body contacts 340 have a circular or elliptical profile from top view, depending on the photolithography and etching techniques. Material of the body contacts 340 is similar to that of the body contacts 143 as discussed previously with respect to FIGS. 1A-1D. Formation of the body contacts 340 includes, by way of example and not limitation, depositing a first ILD layer 361 over the substrate 310 after the doping process of forming the source/drain regions and body contact regions, optionally performing a CMP process to level the first ILD layer 361 with the gate structures 320 and 330, etching contact openings in the first ILD layer 361 to expose body contact regions, depositing one or more conductive materials in the contact openings, and performing a CMP process to planarize the one or more conductive materials with the gate structures 320 and 330. The remaining conductive materials in the contact openings thus serve as body contacts 340.

The integrated circuit 300 further includes an M1 metal line 350 on a next level above the gate structures 320-330 and body contacts 340. The M1 metal line 350 extends across the body contacts 340 along the X-direction, and thus the M1 metal line 350 is electrically connected to the body contact regions B301-B302 by using the body contacts 340. Material of the M1 metal line 350 is similar to that of the M1 metal lines 161 and 162 as discussed previously with respect to FIGS. 1A-1D and thus is not repeated for the sake of brevity. Formation of the M1 metal line 350 includes, by way of example and not limitation, depositing a second ILD layer 362 over the first ILD layer 361, etching a trench in the second ILD layer 362 and across all body contacts 340, depositing one or more conductive materials in the trench, and performing a CMP process to planarize the one or more conductive materials. The remaining conductive materials in the trench thus serve as the M1 metal line 350. In some embodiments, the M1 metal line 350 is a Vdd line extending across multiple active regions 312.

As illustrated in FIG. 3A, by using the active region extensions (interchangeably referred to as drain extensions in this disclosure) 312a and 312b, the intrinsic gate-to-gate distance T303 between the intrinsic gates 322 and 332 can be reduced while keeping the extrinsic gate-to-gate distance T304 between the extrinsic gates 324 and 334 large enough to comply with predetermined design rules. For example, if an SOI IC layout is generated in an automatic place and routing (APR) operation using active region layout patterns (interchangeably referred to as OD layout patterns in some cases) without drain extensions or jogs, the intrinsic gate-to-gate distance in the automatic placed-and-routed layout may be about 1.15-1.25 (e.g., 1.18) times an expected intrinsic gate-to-gate distance. However, if an SOI IC layout is generated using improved active region layout patterns with drain extensions (e.g., the layout of SOI IC 300 having extensions or jogs 312a, 312b), the intrinsic gate-to-gate distance (e.g., the distance T303) in the improved automatic placed-and-routed layout can be reduced to about 0.85-0.97 (e.g., 0.95) times the expected intrinsic gate-to-gate distance. Moreover, because of the shortened intrinsic gate-to-gate distance, the gate density in the SOI IC can be increased by more than about 14% as compared with the case where no drain extension is involved.

Moreover, by merging the drain extensions, signal delays and power consumption in the SOI IC can be reduced. For example, the signal delays in the SOI IC having merged drain extensions (e.g., SOI IC 300) can be reduced by about 1.8% to about 9.5% as compared with the case where no drain extension is involved, and the power consumption in the SOI IC having merged drain extensions can be reduced by about 2% to about 5.75% as compared with the case where no drain extension is involved.

Figure 4:
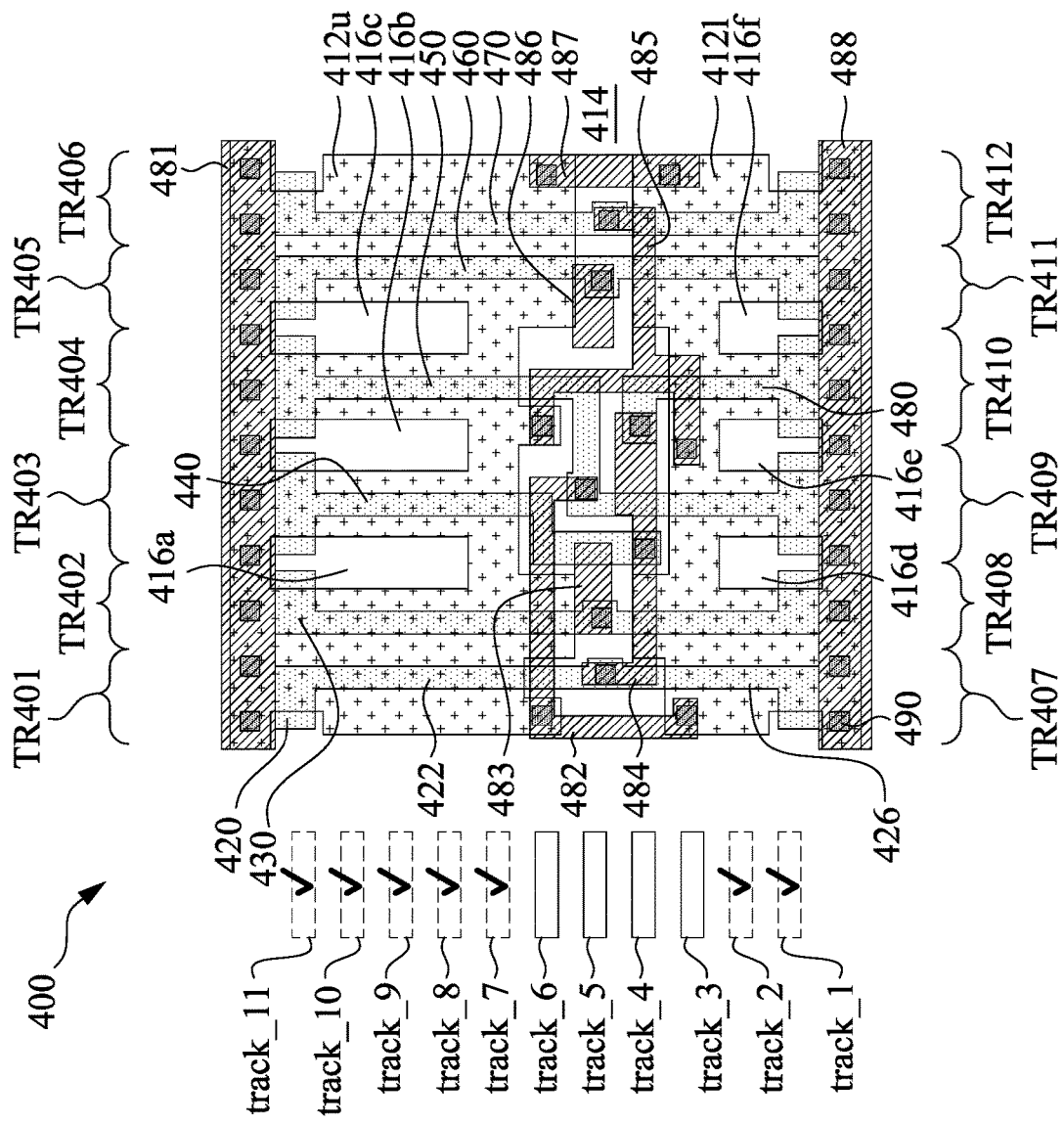
FIG. 4 is a top view of an exemplary integrated circuit illustrating routing tracks on M1 metal layer in accordance with some embodiments of the present disclosure.

In addition to the advantages as discussed above, merging the drain extensions can further save routing resources of M1 metal lines, as will be described in greater detail below. FIG. 4 is a top view of an exemplary integrated circuit 400 illustrating routing tracks on M1 metal layer in accordance with some embodiments of the present disclosure. The integrated circuit 400 includes SOI transistors TR401, TR402, TR403, TR404, TR405 and TR406 arranged side-by-side along the X-direction in an upper row, and SOI transistors TR407, TR408, TR409, TR410, TR411 and TR412 arranged side-by-side along the X-direction in a lower row. More specifically, the integrated circuit 400 includes an SOI substrate with an upper active region 412u and a lower active region 412l defined by an outside isolation region (e.g., STI region) 414, and gate structures 420, 430, 440, 450, 460, 470 and 480 extending along the Y-direction across the upper active region 412u and/or the lower active region 412l.

An upper intrinsic gate 422 of the gate structure 420 forms the SOI transistor TR401 with source/drain regions (not labeled) in the upper active region 412u on opposite sides of the gate structure 420, and a lower intrinsic gate 426 of the gate structure 420 also forms the SOI transistor TR407 with the source/drain regions (not labeled) in the lower active region 412l on opposite sides of the gate structure 420. Similarly, the gate structure 430 forms the SOI transistor TR402 with corresponding source/drain regions in the upper active region 412u and the SOI transistor TR408 with corresponding source/drain regions in the lower active region 412l; the gate structure 440 forms the SOI transistor TR403 with corresponding source/drain regions in the upper active region 412u; the gate structure 450 forms the SOI transistor TR404 with corresponding source/drain regions in the upper active region 412u and the SOI transistor TR409 with corresponding source/drain regions in the lower active region 412l; the gate structure 480 forms the SOI transistor TR410 with corresponding source/drain regions in the lower active region 412l; the gate structure 460 forms the SOI transistor TR405 with corresponding source/drain regions in the upper active region 412u and the SOI transistor TR411 with corresponding source/drain regions in the lower active region 412l; and the gate structure 470 forms the SOI transistor TR406 with corresponding source/drain regions in the upper active region 412u and the SOI transistor TR412 with corresponding source/drain regions in the lower active region 412l.

The integrated circuit 400 includes a plurality of inside isolation regions (e.g., STI regions) 416a, 416b and 416c enclosed within the upper active region 412u. In greater detail, the upper active region 412u has merged source/drain extensions (or jogs) defining a lower boundary of the inside isolation region 416a, merged source/drain extensions defining a lower boundary of the inside isolation region 416b, and merged source/drain extensions defining a lower boundary of the inside isolation region 416c. These merged source/drain extensions of the upper active region 412u allow for drain-to-drain connection, source-to-drain connection and/or source-to-source connection between adjacent two of the SOI transistors TR402, TR403, TR404 and TR405 without using source/drain contacts and an M1 metal line.

Similarly, integrated circuit 400 includes a plurality of inside isolation regions (e.g., STI regions) 416d, 416e and 416f enclosed within the lower active region 412l. In greater detail, the lower active region 412l has merged source/drain extensions (or jogs) defining an upper boundary of the inside isolation region 416d, merged source/drain extensions defining an upper boundary of the inside isolation region 416e, and merged source/drain extensions defining an upper boundary of the inside isolation region 416f. These merged source/drain extensions of the lower active region 412l allow for drain-to-drain connection, source-to-drain connection and/or source-to-source connection between adjacent two of the SOI transistors TR408, TR409, TR410 and TR411 without using source/drain contacts and an M1 metal line, thus saving routing resources for the M1 metal layer, as described in greater detail below.

The integrated circuit 400 includes contacts (e.g., gate contacts, source/drain contacts, and body contacts) 490 and an M1 metal layer on a next level above the gate structures 440-470 and the contacts 490. The M1 metal layer includes M1 metal lines 481, 482, 483, 484, 485, 486, 487 and 488. The M1 metal lines 481 and 488 are Vdd lines respectively extending across body contact regions of the upper active region 412u and the lower active region 412l. The M1 metal line 481 is electrically connected to the body contact region of the upper active region 412u by using a plurality of body contacts 490, and the M1 metal line 488 is electrically connected to the body contact region of the lower active region 412l by using a plurality of body contacts 490.

The M1 metal line 482 has an X-directional extending portion routed on track_6 of an imaginary routing grid, a left-side Y-directional portion extending from track_6 of the imaginary routing grid to track_3 of the imaginary routing grid, and a right side Y-directional portion extending from track_6 of the imaginary routing grid to track_5 of the imaginary routing grid. The M1 metal line 482 is electrically connected to the source/drain region of the SOI transistor TR401 by using a source/drain contact 490, to the source/drain region of the SOI transistor TR407 by using a source/drain contact 490, and also to the gate structure 450 by using a gate contact 490.

The M1 metal line 483 is routed on the track_5 of the imaginary routing grid and electrically connected to the gate structure 430 by using a gate contact 490. The M1 metal line 484 has an X-directional extending portion routed on track_4 of the imaginary routing grid and a Y-directional extending portion extending from track_4 of the imaginary routing grid to track_5 of the imaginary routing grid. The M1 metal line 484 is electrically connected to the gate structure 420 by using a gate contact 490, to the gate structure 440 by using a gate contact 490, and also to the gate structure 480 by using another gate contact 490.

The M1 metal line 485 has three X-directional extending portions respectively routed on track_6, track_3 and track_4 of the imaginary routing grid and an Y-directional extending portion extending from track_3 to track_6 of the imaginary routing grid. The M1 metal line 485 is electrically connected to the merged source/drain regions of the SOI transistors TR403 and TR404 by using a source/drain contact 490, to the merged source/drain regions of the SOI transistors TR409 and TR410 by using a source/drain contact 490, and to the gate structure 470 by using a gate contact 490. The metal line 486 is routed on track_5 of the imaginary routing grid and is electrically connected to the gate structure 460 by using a gate contact 490. The metal line 487 extends from track_3 to track_6 of the imaginary routing grid and is electrically connected to the source/drain regions of the SOI transistors TR406 and TR412 by using respective source/drain contacts 490.

As described above with respect to the M1 metal lines of the integrated circuit structure 400, none of M1 metal lines illustrated in FIG. 4 is routed on track_1, track_2 and track_7-track_11 of the imaginary routing grid. Therefore, in the integrated circuit 400 there are at least seven routing tracks available for routing other circuits. By contrast, if the upper active region 412a has no merged source/drain extensions for drain-to-drain connection, source-to-source connection and/or source-to-source connection, an additional metal line configured for the drain-to-drain connection, source-to-drain connection and/or source-to-source connection would be routed on track_7, track_8, track_9 or track_10 (e.g., routed on track_7) of the imaginary routing grid, thus costing an additional routing track. As a result, the integrated circuit 400 with merged active region extensions can save routing resources of M1 metal layer.

Figure 5:
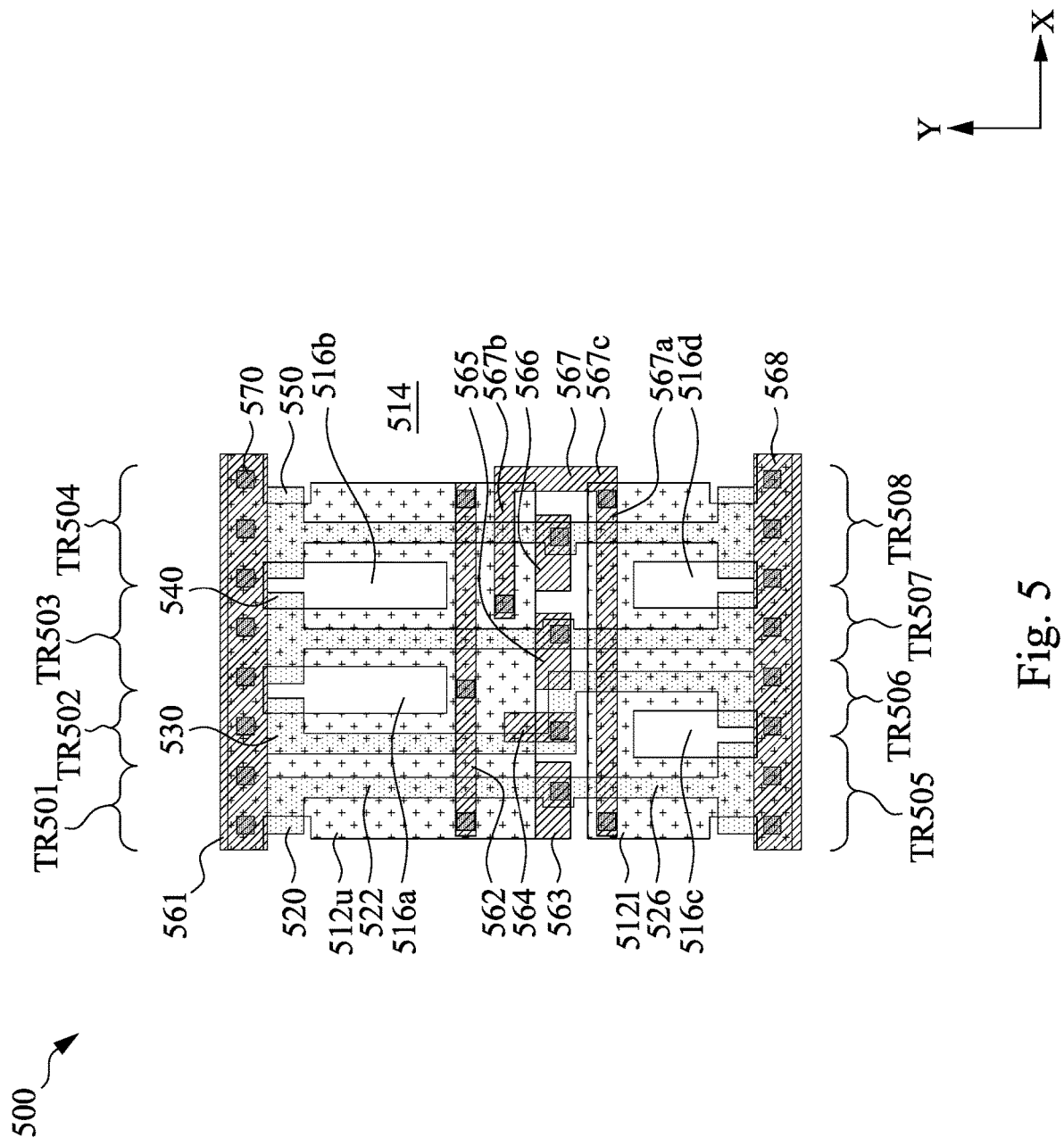
FIG. 5 is a top view of an exemplary integrated circuit in accordance with some embodiments of the present disclosure.

FIG. 5 is a top view of an exemplary integrated circuit 500 in accordance with some embodiments of the present disclosure. As illustrated in FIG. 5, the integrated circuit 500 includes SOI transistors TR501, TR502, TR503, TR504 arranged side-by-side along the X-direction in an upper row, and SOI transistors TR505, TR506, TR507 and TR508 arranged side-by-side along the X-direction in a lower row. The integrated circuit 500 includes an SOI substrate with an upper active region 512u and a lower active region S121 defined by an outside isolation region (e.g., STI region) 514, and gate structures 520, 530, 540 and 550 extending along the Y-direction across both the upper active region 512u and the lower active region S121.

An upper intrinsic gate 522 of the gate structure 520 forms the SOI transistor TR501 with source/drain regions (not labeled) in the upper active region 512u on opposite sides of the gate structure 520, and a lower intrinsic gate 526 of the gate structure 520 forms the SOI transistor TR505 with the source/drain regions (not labeled) in the lower active region 512l on opposite sides of the gate structure 520. Similarly, the gate structure 530 forms the SOI transistor TR502 with corresponding source/drain regions in the upper active region 512u and the SOI transistor TR506 with corresponding source/drain regions in the lower active region 512l; the gate structure 540 forms the SOI transistor TR503 with corresponding source/drain regions in the upper active region 512u and the SOI transistor TR507 with corresponding source/drain regions in the lower active region 512l; and the gate structure 550 forms the SOI transistor TR504 with corresponding source/drain regions in the upper active region 512u and the SOI transistor TR508 with corresponding source/drain regions in the lower active region 512l.

The integrated circuit 500 includes a plurality of inside isolation regions (e.g., STI regions) 516a and 516b enclosed within the upper active region 512u. In greater detail, the upper active region 512u has merged source/drain extensions (or jogs) defining a lower boundary of the inside isolation region 516a, and merged source/drain extensions defining a lower boundary of the inside isolation region 516b. These merged source/drain extensions of the upper active region 512u allow for drain-to-drain connection, source-to-drain connection and/or source-to-source connection between adjacent two of the SOI transistors TR502, TR503 and TR504 without using source/drain contacts and additional M1 metal lines.

Similarly, integrated circuit 500 includes a plurality of inside isolation regions (e.g., STI regions) 516c and 516d enclosed within the lower active region 512l. In greater detail, the lower active region 512l has merged source/drain extensions (or jogs) defining an upper boundary of the inside isolation region 516c, and merged source/drain extensions defining an upper boundary of the inside isolation region 516d. These merged source/drain extensions of the lower active region 512l allow for drain-to-drain connection, source-to-drain connection and/or source-to-source connection between the SOI transistors TR505 and TR506 and between SOI transistors TR507 and TR508 without using source/drain contacts and additional M1 metal lines.

The integrated circuit 500 further includes contacts (e.g., gate contacts, source/drain contacts, and body contacts) 570 and an M1 metal layer on a next level above the gate structures 520-550 and the contacts 570. The M1 metal layer includes M1 metal lines 561, 562, 563, 564, 565, 566, 567 and 568. The M1 metal lines 561 and 568 are Vdd lines respectively extending across body contact regions of the upper active region 512u and the lower active region 512l. The M1 metal line 561 is electrically connected to the body contact region of the upper active region 512u by using a plurality of body contacts 570, and the M1 metal line 568 is electrically connected to the body contact region of the lower active region 512l by using a plurality of body contacts 570.

The M1 metal line 562 extends along the X-direction across the SOI transistors TR501-TR504. The M1 metal line 562 is electrically connected to a source/drain region of the SOI transistor TR501 by using a source/drain contact 570, to the merged source/drain extensions of the SOI transistors TR502 and TR503, and to a source/drain region of the SOI transistor TR504. The M1 metal line 563 extends along the X-direction across the gate structure 520 and is electrically connected to the gate structure 520 by using a gate contact 570. The M1 metal line 564 extends along the Y-direction across the gate structure 530 and is electrically connected to the gate structure 530 by using a gate contact 570. The M1 metal line 565 extends along the X-direction across the gate structure 540 and is electrically connected to the gate structure 540 by using a gate contact 570. The M1 metal line 566 extends along the X-direction across the gate structure 550 and is electrically connected to the gate structure 550 by using a gate contact 570. The M1 metal line 567 has a lower X-directional extending portion 567a extending across the SOI transistors TR505-TR508 in the lower row, an upper X-directional extending portion 567b extending across the SOI transistor TR504 in the upper row and shorter than the lower X-directional extending portion 567*a*, and a Y-directional extending portion 567*c* connecting the lower X-directional extending portion 567*a* and the upper X-directional extending portion 567*b*. The M1 metal line 567 is electrically connected to a source/drain region of the SOI transistor TR505 by using a source/drain contact 570, to a source/drain region of the SOI transistor TR508 by using a source/drain contact 570, and to merged source/drain extensions of the SOI transistors TR503 and TR504.

Figure 6:
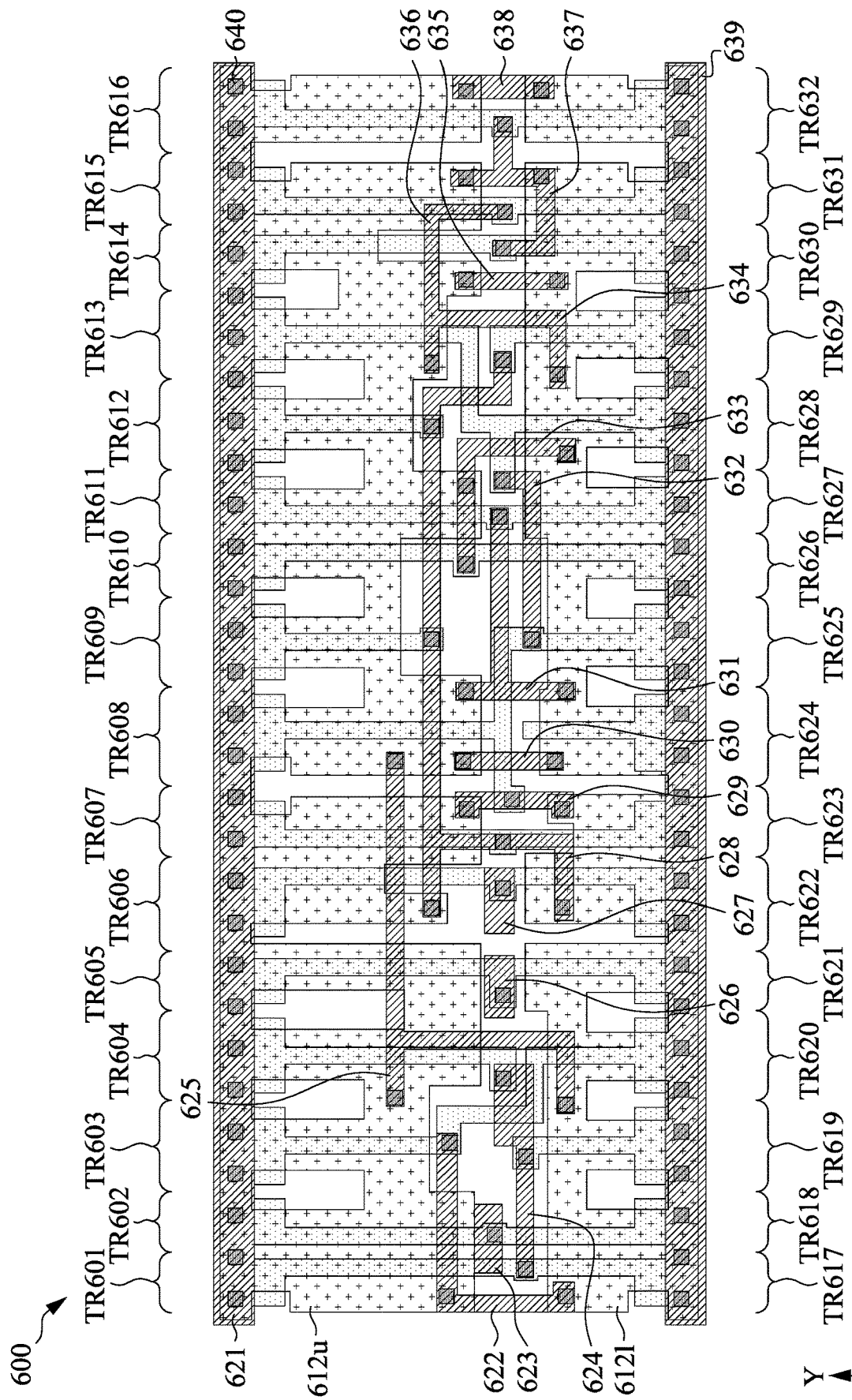
FIG. 6 is a top view of an exemplary integrated circuit in accordance with some embodiments of the present disclosure.

FIG. 6 is a top view of an exemplary integrated circuit 600 in accordance with some embodiments of the present disclosure. As illustrated in FIG. 6, the integrated circuit 600 includes SOI transistors TR601, TR602, TR603, TR604, TR605, TR606, TR607, TR608, TR609, TR610, TR611, TR612, TR613, TR614, TR615 and TR616 formed on an upper active region 612*u* and arranged side-by-side along the X-direction in an upper row, and SOI transistors TR617, TR618, TR619, TR620, TR621, TR622, TR623, TR624, TR625, TR626, TR627, TR628, TR629, TR630, TR631 and TR632 formed on a lower active region 612*l* and arranged side-by-side along the X-direction in a lower row. The integrated circuit 600 includes a plurality of inside isolation regions (e.g., STI regions, not labeled) enclosed within the upper active region 612*u* and the lower active region 612*l*. In greater detail, the upper active region 612*u* has merged source/drain extensions (or jogs) defining lower boundaries of the inside isolation regions, and the lower active region 612*l* has merged source/drain extensions defining upper boundaries of the inside isolation regions. The merged source/drain extensions of the upper and lower active regions 612*u* and 612*l* allow for drain-to-drain connection, source-to-drain connection and/or source-to-source connection between corresponding two of the SOI transistors without using source/drain contacts and additional M1 metal lines.

The integrated circuit 600 further includes contacts (e.g., gate contacts, source/drain contacts, and body contacts) 640 and an M1 metal layer having a plurality of M1 metal lines 621-639 on a next level above gate structures of the SOI transistors TR601-TR632 and the contacts 640. The M1 metal lines 621 and 639 are Vdd lines respectively extending across body contact regions of the upper active region 612*u* and the lower active region 612*l*. The M1 metal line 621 is electrically connected to the body contact region of the upper active region 612*u* by using a plurality of body contacts 640, and the M1 metal line 639 is electrically connected to the body contact region of the lower active region 612*l* by using a plurality of body contacts 640.

The M1 metal line 622 has an X-directional extending portion extending across the SOI transistors TR601-603 and a Y-directional extending portion extending from a source/drain region of the SOI transistor TR601 in the upper row to a source/drain region of the SOI transistor TR617 in the lower row. The M1 metal line 622 is electrically connected to the source/drain region of the SOI transistor TR601 by using a source/drain contact 640, to the source/drain region of the SOI transistor TR617 by using a source/drain contact 640, and to a shared gate structure of the upper-row SOI transistor TR603 and the lower-row SOI transistor TR620 by using a gate contact 640.

The M1 metal line 623 extends along the X direction across a shared gate structure of the upper-row SOI transistor TR602 and the lower-row SOI transistor TR618, and is electrically connected to the shared gate structure by using a gate contact 640.

The M1 metal line 624 extends along the X-direction across a shared gate structure of the upper-row SOI transistor TR601 and the lower-row SOI transistor TR 617, the shared gate structure of the upper-row SOI transistor TR602 and the lower-row SOI transistor TR 618, a gate structure of the lower-row SOI transistor TR619, and the shared gate structure of the upper-row SOI transistor TR603 and the lower-row SOI transistor TR620, to a gate structure of the upper-row SOI transistor TR604. The M1 metal line 624 is electrically connected to the shared gate structure of the SOI transistors TR601 and TR617 by using a gate contact 640, to the gate structure of the SOI transistor TR619 by using a gate contact 640, and to the gate structure of the SOI transistor TR604 by using a gate contact 640.

The M1 metal line 625 has an upper X-directional extending portion extending along the X-direction from the merged source/drain extensions of the upper-row SOI transistors TR603 and TR604 to a source/drain region of the upper-row SOI transistor TR608, a lower X-directional extending portion extending along the X-direction across the gate structure of the lower-row SOI transistor TR620, and a Y-directional extending portion connecting the upper and lower X-directional extending portions. The M1 metal line 625 is electrically connected to the merged source/drain extensions of the upper-row SOI transistors TR603 and TR604 by using a source/drain contact 640, to the source/drain region of the SOI transistor TR608 by using a source/drain contact 640, and to merged source/drain extensions of the lower-row SOI transistors TR619 and TR620 by using a source/drain contact 640.

The M1 metal line 626 extends along the X-direction across the shared gate structure of the upper-row SOI transistor TR605 and the lower-row SOI transistor TR621, and is electrically connected to this shared gate structure by using a gate contact 640. The M1 metal line 627 extends along the X-direction across the shared gate structure of the upper-row SOI transistor TR606 and the lower-row SOI transistor TR622, and is electrically connected to this shared gate structure by using a gate contact 640.

The M1 metal line 628 includes an upper X-directional extending portion extending from a source/drain region of the upper-row SOI transistor TR606 to across a gate structure of the upper-row SOI transistor TR612, a lower X-directional extending portion extending across the gate structures of the lower-row SOI transistors TR622 and TR623 and a Y-directional extending portion connecting the upper and lower X-directional extending portions. The M1 metal line 628 further includes a branch extending from a rightmost end of the upper X-directional extending portion to a gate structure of the lower-row SOI transistor TR629. The M1 metal line 628 is electrically connected to the source/drain region of the upper-row SOI transistor TR606 by using a source/drain contact 640, to the source/drain region of the lower-row SOI transistor TR622 by using a source/drain contact, to the shared gate structure of the upper-row SOI transistor TR607 and the lower-row SOI transistor TR623 by using a gate contact 640, to the gate structure of the upper-row SOI transistor TR609 by using a gate contact 640, to the gate structure of the upper-row SOI transistor TR612 by using a gate contact 640, and to the gate structure of the lower-row SOI transistor TR629 by using a gate contact 640.

The M1 metal line 629 extends along the Y-direction from a source/drain region of the upper-row SOI transistor TR607 to a source/drain region of the lower-row SOI transistor TR623 and across a branch of the shared gate structure of the upper-row SOI transistor TR608 and the lower-row SOI transistor TR625. The M1 metal line 629 is electrically connected to the source/drain region of the upper-row SOI transistor TR607 by using a source/drain contact 640, to the source/drain region of the lower-row SOI transistor TR623 by using a source/drain contact 640, and to the branch of the shared gate structure of the transistors TR608 and TR625 by using a gate contact 640.

The M1 metal line 630 extends along the Y-direction from a source/drain region of the upper-row SOI transistor TR608 to a source/drain region of the lower-row SOI transistor TR624. The M1 metal line 630 is electrically connected to the source/drain region of the SOI transistor TR608 by using a source/drain contact 640, and to the source/drain region of the SOI transistor TR624 by using a source/drain contact 640.

The M1 metal line 631 has a Y-directional extending portion extending from merged source/drain extensions of the upper-row SOI transistors TR608 and TR609 to merged source/drain extensions of the lower-row SOI transistors TR624 and TR625, and an X-directional extending portion extending from the Y-directional extending portion along the X-direction to the shared gate structure of the upper-row SOI transistor TR611 and the lower-row SOI transistor TR627. The M1 metal line 631 is electrically connected to the merged source/drain extensions of the upper-row SOI transistors TR608 and TR609 by using a source/drain contact 640, to the merged source/drain extensions of the lower-row SOI transistors TR624 and TR625 by using a source/drain contact 640, and to the shared gate structure of the upper-row SOI transistor TR611 and the lower-row SOI transistor TR627 by using a gate contact 640.

The M1 metal line 632 has an L-shaped top view profile extending from the shared gate structure of the upper-row SOI transistor TR608 and the lower-row SOI transistor TR625 to the shared gate structure of the upper-row SOI transistor TR613 and the lower-row SOI transistor TR628. The M1 metal line 632 is electrically connected to the shared gate structure of the upper-row SOI transistor TR608 and the lower-row SOI transistor TR625 by using a gate contact 640, and to the shared gate structure of the upper-row SOI transistor TR613 and the lower-row SOI transistor TR628 by using a gate contact 640.

The M1 metal line 633 has an X-directional extending portion extending from the shared gate structure of the upper-row SOI transistor TR610 and the lower-row SOI transistor TR626 to the merged source/drain extensions of the SOI transistors TR611 and TR612, and a Y-directional extending portion extending from a rightmost end of the X-directional extending portion to the merged source/drain extensions of the lower-row SOI transistors TR627 and TR628. The M1 metal line 633 is electrically connected to the shared gate structure of the upper-row SOI transistor TR610 and the lower-row SOI transistor TR626 by using a gate contact 640, to the merged source/drain extensions of the SOI transistors TR611 and TR612 by using a source/drain contact 640, and to the merged source/drain extensions of the lower-row SOI transistors TR627 and TR628 by using a source/drain contact 640.

The M1 metal line 634 includes an upper X-directional extending portion extending from the merged source/drain extensions of the upper-row SOI transistors TR612 and TR613 to the shared gate structure of the upper-row SOI transistor TR615 and the lower-row SOI transistor TR631, a lower X-directional extending portion extending across the gate structure of the lower-row SOI transistor TR629, and a Y-directional extending portion connecting the upper and lower X-directional extending portions. The M1 metal line 634 further includes a Y-directional extension extending along the shared gate structure of the upper-row SOI transistor TR615 and the lower-row SOI transistor TR631. The M1 metal line 634 is electrically connected to the merged source/drain extensions of the upper-row SOI transistors TR612 and TR613 by using a source/drain contact 640, to the merged source/drain extensions of the lower-row SOI transistors TR628 and TR629 by using a source/drain contact 640, and to the shared gate structure of the upper-row SOI transistor TR615 and the lower-row SOI transistor TR631 by using a gate contact 640.

The M1 metal line 635 extends along the Y-direction from the merged source/drain extensions of the upper-row SOI transistors TR613 and TR614 to the merged source/drain extensions of the lower-row SOI transistors TR629 and TR630. The M1 metal line 635 is electrically connected to the merged source/drain extensions of the upper-row SOI transistors TR613 and TR614 by using a source/drain contact 640, and to the merged source/drain extensions of the lower-row SOI transistors TR629 and TR630 by using another source/drain contact 640.

The M1 metal line 636 has an L-shaped top view profile extending from the merged source/drain extensions of the upper-row SOI transistors TR612 and TR613 to the shared gate structure of the upper-row SOI transistor TR615 and the lower-row SOI transistor TR631. The M1 metal line 636 is electrically connected to the merged source/drain extensions of the upper-row SOI transistors TR612 and TR613 by using a source/drain contact 640, and to the shared gate structure of the upper-row SOI transistor TR615 and the lower-row SOI transistor TR631 by using a gate contact 640.

The M1 metal line 637 is electrically connected to the shared gate structure of the upper-row SOI transistor TR614 and the lower-row SOI transistor TR630 by using a gate contact 640, to a source/drain region of the lower-row SOI transistor TR631 by using a source/drain contact 640, to a source/drain region of the upper-row SOI transistor TR615 by using a source/drain contact 640, and to the shared gate structure of the upper-row SOI transistor TR616 and the lower-row SOI transistor TR632 by using a gate contact 640.

The M1 metal line 638 extends along the Y-direction from a source/drain region of the upper-row SOI transistor TR616 to a source/drain region of the lower-row SOI transistor TR632. The M1 metal line 638 is electrically connected to the source/drain region of the upper-row SOI transistor TR616 by using a source/drain contact 640, and to the source/drain region of the lower-row SOI transistor TR632 by using a source/drain contact 640.

Figure 7:
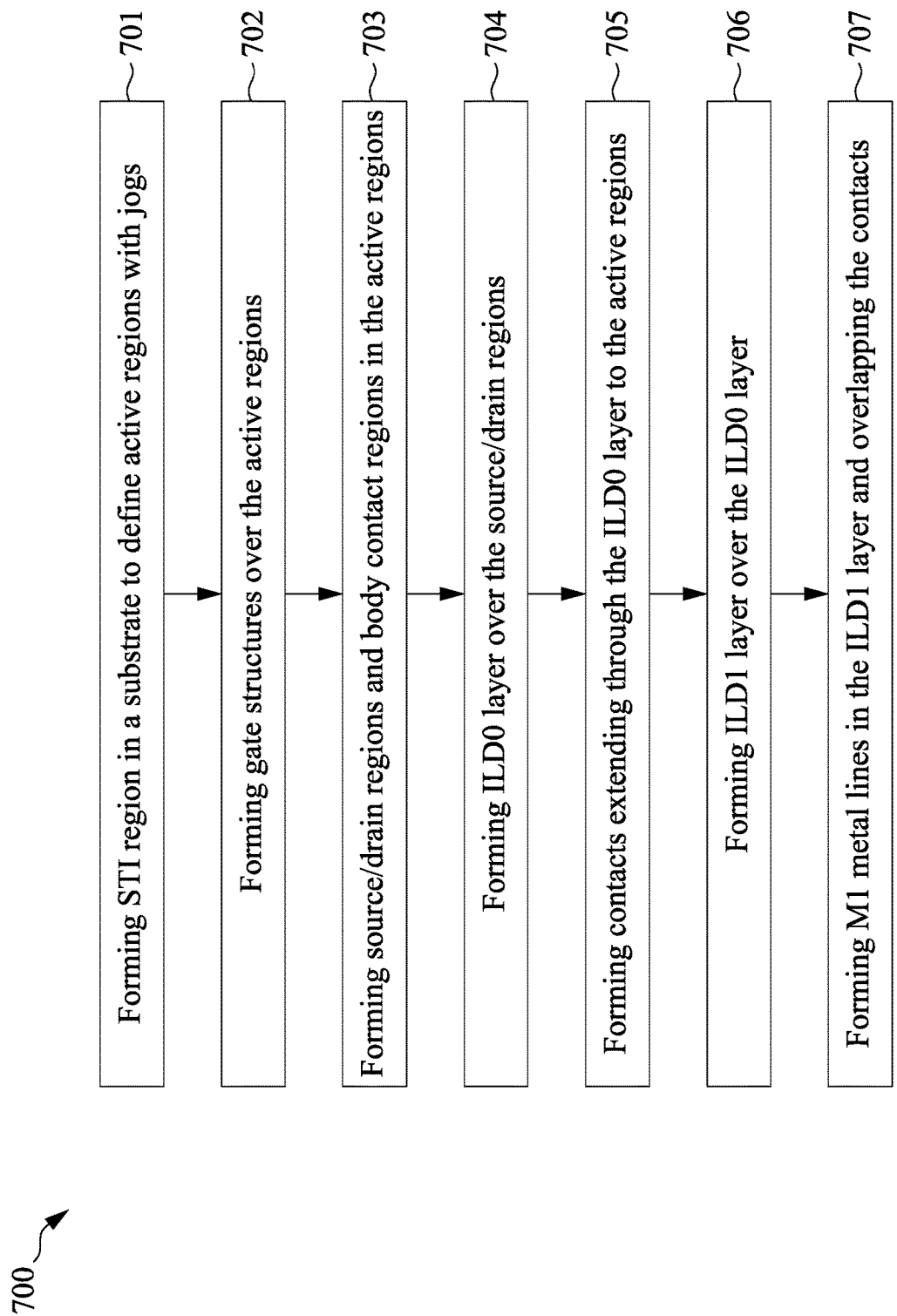
FIG. 7 is a flow chart illustrating a method of forming an SOI IC in accordance with some embodiments of the present disclosure.

FIG. 7 is a flow chart illustrating a method 700 of forming an SOI IC in accordance with some embodiments of the present disclosure. Although the method 700 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block 701 of the method 700, STI regions are formed in a semiconductor layer of an SOI substrate to define active regions with extensions (or jogs). FIGS. 1A, 2A, 3A, 5, and 6 illustrate top view of example active regions with extensions in accordance with some embodiments. Formation of the STI regions includes, for example, patterning the semiconductor layer to form trenches in the semiconductor layer, and forming dielectric materials in the trenches.

At block 702 of the method 700, gate structures are formed over the active regions. FIGS. 1A, 2A, 3A, 5, and 6 illustrate top view of example gate structures in accordance with some embodiments. The gate structures may be formed using, for example, depositing in sequence a gate dielectric layer and a gate electrode layer, and patterning the stack of gate electrode layer and the gate dielectric layer into gate structures.

At block 703 of the method 700, source/drain regions and body contact regions are formed in the active regions. FIGS. 1A, 2A, 3A, 5, and 6 illustrate top view of example source/drain regions and body contact regions in accordance with some embodiments. The source/drain regions and body contact regions may be formed using, for example, ion implantation process to dope n-type dopant and/or p-type dopant into the active region, followed by annealing process to activate the implanted n-type and/or p-type dopant.

At block 704 of the method 700, a first ILD layer (interchangeably referred to as ILD0 layer) is formed over the source/drain regions and the body contact regions. FIGS. 1B-1D, 2B-2D and 3B-3D illustrate cross-sectional views of example ILD0 layer. The ILD0 layer may be formed using, for example, suitable deposition techniques such as CVD.

At block 705 of the method 700, source/drain contacts, gate contacts and body contacts are formed through the ILD0 layer to the active regions. FIGS. 1A, 2A, 3A, 5, and 6 illustrate top view of example source/drain contacts, gate contacts and body contacts in accordance with some embodiments. These contacts may be formed using, for example, patterning the ILD0 layer to form contact openings or holes extending through the ILD0 layer, and depositing one or more metals into the contact openings.

At block 706 of the method 700, a second ILD layer (interchangeably referred to as ILD1 layer) is formed over the ILD0 layer. FIGS. 1B-1D, 2B-2D and 3B-3D illustrate cross-sectional views of example ILD1 layer. The ILD1 layer may be formed using, for example, suitable deposition techniques such as CVD.

At block 707 of the method 700, M1 metal lines are formed in the ILD1 layer and overlapping the corresponding contacts. FIGS. 1A, 2A, 3A, 5, and 6 illustrate top view of example M1 metal lines in accordance with some embodiments. These M1 metal lines may be formed using, for example, patterning the ILD1 layer to form trenches in the ILD1 layer, and depositing one or more metals into the trenches.

Figure 8:
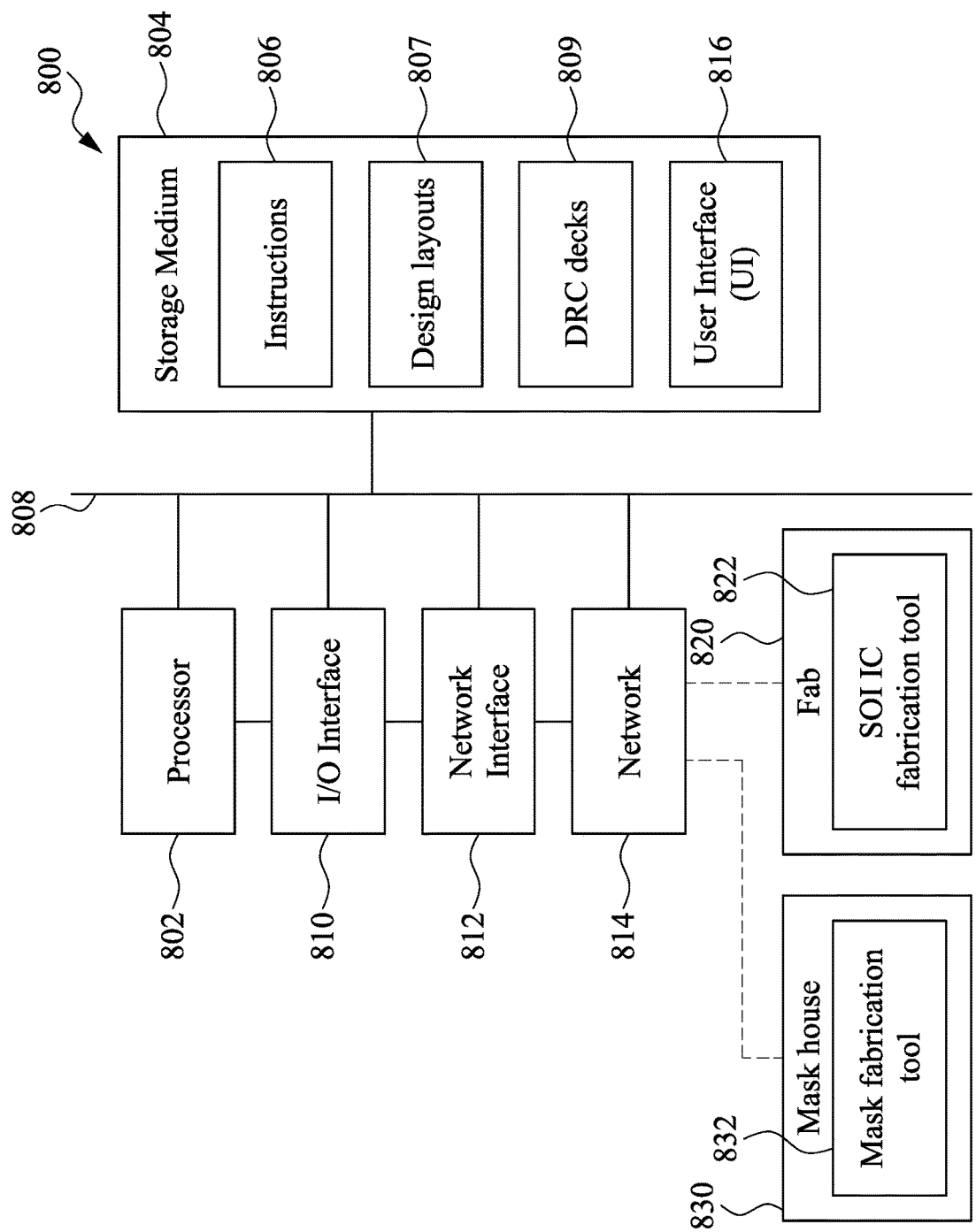
FIG. 8 is a schematic diagram of an electronic design automation (EDA) system, in accordance with some embodiments.

FIG. 8 is a schematic diagram of an electronic design automation (EDA) system 800, in accordance with some embodiments. Methods described herein of generating design layouts, e.g., layouts of the SOI integrated circuits 100, 200, 300, 400, 500, and 600, in accordance with one or more embodiments, are implementable, for example, using EDA system 800, in accordance with some embodiments. In some embodiments, EDA system 800 is a general purpose computing device that is capable of executing an APR operation. The EDA system 800 including a hardware processor 802 and a non-transitory, computer-readable storage medium 804. Computer-readable storage medium 804, amongst other things, is encoded with, i.e., stores, a set of executable instructions 806, design layouts 807, design rule check (DRC) decks 809 or any intermediate data for executing the set of instructions. Each design layout 807 comprises a graphical representation of an integrated chip, such as for example, a GSII file. Each DRC deck 809 comprises a list of design rules specific to a semiconductor process chosen for fabrication of a design layout 807. Execution of instructions 806, design layouts 807 and DRC decks 809 by hardware processor 802 represents (at least in part) an EDA tool which implements a portion or all of, e.g., the methods described herein in accordance with one or more (hereinafter, the noted processes and/or methods).

Processor 802 is electrically coupled to computer-readable storage medium 804 via a bus 808. Processor 802 is also electrically coupled to an I/O interface 810 by bus 808. A network interface 812 is also electrically connected to processor 802 via bus 808. Network interface 812 is connected to a network 818, so that processor 802 and computer-readable storage medium 804 are capable of connecting to external elements via network 814. Processor 802 is configured to execute instructions 806 encoded in computer-readable storage medium 804 in order to cause EDA system 800 to be usable for performing a portion or all of the noted processes and/or methods. In one or more embodiments, processor 802 is a central processing unit (CPU), a multi-processor, a distributed processing system, an application specific integrated circuit (ASIC), and/or a suitable processing unit.

In one or more embodiments, computer-readable storage medium 804 is an electronic, magnetic, optical, electromagnetic, infrared, and/or a semiconductor system (or apparatus or device). For example, computer-readable storage medium 804 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 804 includes a compact disk-read only memory (CD-ROM), a compact disk-read/write (CD-R/W), and/or a digital video disc (DVD).

In one or more embodiments, computer-readable storage medium 804 stores instructions 806, design layouts 807 (e.g., layouts of the SOI integrated circuits 100, 200, 300, 400, 500 and 600 as discussed previously) and DRC decks 809 configured to cause EDA system 800 (where such execution represents (at least in part) the EDA tool) to be usable for performing a portion or all of the noted processes and/or methods. In one or more embodiments, storage medium 804 also stores information which facilitates performing a portion or all of the noted processes and/or methods.

EDA system 800 includes I/O interface 810. I/O interface 810 is coupled to external circuitry. In one or more embodiments, I/O interface 810 includes a keyboard, keypad, mouse, trackball, trackpad, touchscreen, and/or cursor direction keys for communicating information and commands to processor 802.

EDA system 800 also includes network interface 812 coupled to processor 802. Network interface 812 allows EDA system 800 to communicate with network 814, to which one or more other computer systems are connected. Network interface 812 includes wireless network interfaces such as BLUETOOTH, WIFI, WIMAX, GPRS, or WCDMA; or wired network interfaces such as ETHERNET, USB, or IEEE-1388. In one or more embodiments, a portion or all of noted processes and/or methods, is implemented in two or more EDA systems 800.

EDA system 800 is configured to receive information through I/O interface 810. The information received through I/O interface 810 includes one or more of instructions, data, design rules, libraries of standard cells, and/or other parameters for processing by processor 802. The information is transferred to processor 802 via bus 808. EDA system 800 is configured to receive information related to a user interface (UI) 816 through I/O interface 810. The information is stored in computer-readable medium 804 as UI 816.

In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Also illustrated in FIG. 8 are fabrication tools associated with the EDA system 800. For example, a mask house 830 receives a design layout from the EDA system 800 by, for example, the network 814, and the mask house 830 has a mask fabrication tool 832 (e.g., a mask writer) for fabricating one or more photomasks (e.g., photomasks used for fabricating e.g., SOI integrated circuits 100, 200, 300, 400, 500 and/or 600) based on the design layout generated from the EDA system 800. An IC fabricator ("Fab") 820 may be connected to the mask house 830 and the EDA system 800 by, for example, the network 814. Fab 820 includes an IC fabrication tool 822 for fabricating IC chips (e.g., SOI integrated circuits 100, 200, 300, 400, 500 and/or 600) using the photomasks fabricated by the mask house 830. By way of example and not limitation, the IC fabrication tool 822 includes one or more cluster tools for fabricating IC chips. The cluster tool may be a multiple reaction chamber type composite equipment which includes a polyhedral transfer chamber with a wafer handling robot inserted at the center thereof, a plurality of process chambers (e.g., CVD chamber, PVD chamber, etching chamber, annealing chamber or the like) positioned at each wall face of the polyhedral transfer chamber; and a loadlock chamber installed at a different wall face of the transfer chamber.

Figure 9:
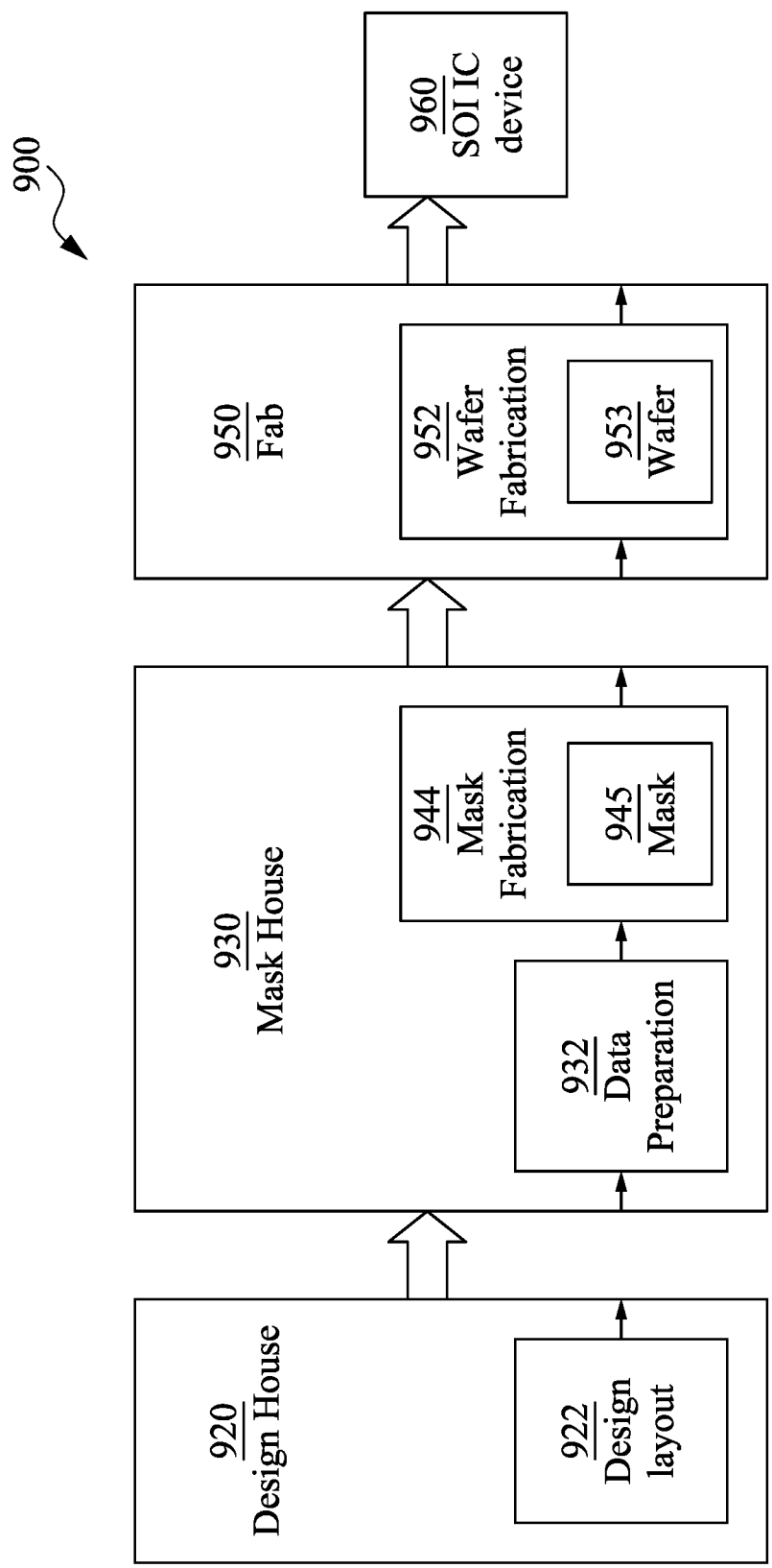
FIG. 9 is a block diagram of an IC manufacturing system, and an IC manufacturing flow associated therewith, in accordance with some embodiments.

FIG. 9 is a block diagram of an IC manufacturing system 900, and an IC manufacturing flow associated therewith, in accordance with some embodiments. In some embodiments, based on design layout, e.g., layout of SOI integrated circuit 100, 200, 300, 400, 500 or 600, at least one of one or more photomasks or at least one component in a layer of a semiconductor device is fabricated using manufacturing system 900.

In FIG. 9, an IC manufacturing system 900 includes entities, such as a design house 920, a mask house 930, and a Fab 950, that interact with one another in the design, development, and manufacturing cycles and/or services related to manufacturing SOI ICs 960. The entities in SOI manufacturing system 900 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 920, mask house 930, and Fab 950 is owned by a single larger company. In some embodiments, two or more of design house 920, mask house 930, and Fab 950 coexist in a common facility and use common resources.

Design house (or design team) 920 generates design layouts 922 (e.g., layouts of SOI ICs 100, 200, 300, 400, 500 and/or 600). Design layouts 922 include various geometrical patterns designed for SOI ICs 960 (e.g., SOI ICs 100, 200, 300, 400, 500 and/or 600). The geometrical patterns correspond to patterns of metal, oxide, or semiconductor layers that make up the various components of SOI ICs 960 to be fabricated. The various layers combine to form various device features. For example, a portion of design layout 922 includes various circuit features, such as active regions with extensions (or jogs), gate structures, gate contacts, source/drain contacts, body contacts, and/or metal lines, to be formed on an SOI wafer. Design house 920 implements a proper design procedure to form design layout 922. The design procedure includes one or more of logic design, physical design or place and route. Design layout 922 is presented in one or more data files having information of the geometrical patterns and a netlist of various nets. For example, design layout 922 can be expressed in a GDSII file format or DFII file format.

Mask house 930 includes data preparation 932 and mask fabrication 944. Mask house 930 uses design layout 922 (e.g., layout of SOI IC 100, 200, 300, 400, 500 or 600) to manufacture one or more photomasks 945 to be used for fabricating the various layers of SOI IC 960 according to design layout 922. Mask house 930 performs mask data preparation 932, where design layout 922 is translated into a representative data file ("RDF"). Mask data preparation 932 provides the RDF to mask fabrication 944. Mask fabrication 944 includes a mask writer. A mask writer converts the RDF to an image on a substrate, such as a photomask (reticle) 945 or a semiconductor wafer 953. Design layout 922 is manipulated by mask data preparation 932 to comply with particular characteristics of the mask writer and/or rules of fab 950. In FIG. 9, mask data preparation 932 and mask fabrication 944 are illustrated as separate elements. In some embodiments, mask data preparation 932 and mask fabrication 944 can be collectively referred to as mask data preparation.

In some embodiments, mask data preparation 932 includes optical proximity correction (OPC) which uses lithography enhancement techniques to compensate for image errors, such as those that can arise from diffraction, interference, other process effects and the like. OPC adjusts design layout 922. In some embodiments, mask data preparation 932 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 932 includes a mask rule checker (MRC) that checks design layout 922 that has undergone processes in OPC with a set of mask creation rules which contain certain geometric and/or connectivity restrictions to ensure sufficient margins, to account for variability in semiconductor manufacturing processes, and the like. In some embodiments, the MRC modifies design layout diagram 922 to compensate for limitations during mask fabrication 944, which may undo part of the modifications performed by OPC in order to meet mask creation rules.

In some embodiments, mask data preparation 932 includes lithography process checking (LPC) that simulates processing that will be implemented by Fab 950 to fabricate SOI IC 960. LPC simulates this processing based on design layout 922 to create a simulated manufactured integrated circuit, such as SOI IC 960. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine design layout 922.

One of ordinary skill would understand that the above description of mask data preparation 932 has been simplified for the purposes of clarity. In some embodiments, data preparation 932 includes additional features such as a logic operation (LOP) to modify design layout 922 according to manufacturing rules. Additionally, the processes applied to design layout 922 during data preparation 932 may be executed in a variety of different orders.

After mask data preparation 932 and during mask fabrication 944, a photomask 945 or a group of photomasks 945 are fabricated based on the design layout 922. In some embodiments, mask fabrication 944 includes performing one or more lithographic exposures based on the design layout 922. In some embodiments, an electron-beam (e-beam) or a mechanism of multiple e-beams is used to form a pattern on a photomask 945 based on design layout 922. Photomask 945 can be formed in various technologies. In some embodiments, photomask 945 is formed using binary technology. In some embodiments, a mask pattern includes opaque regions and transparent regions. A radiation beam, such as an ultraviolet (UV) beam, used to expose the radiation sensitive material layer (e.g., photoresist) which has been coated on a wafer, is blocked by the opaque regions and transmits through the transparent regions. In one example, a binary mask version of photomask 945 includes a transparent substrate (e.g., fused quartz) and an opaque material (e.g., chromium) coated in the opaque regions of the binary mask. In another example, photomask 945 is formed using a phase shift technology. In a phase shift mask (PSM) version of photomask 945, various features in the pattern formed on the phase shift photomask are configured to have proper phase difference to enhance the resolution and imaging quality. In various examples, the phase shift photomask can be attenuated PSM or alternating PSM. The photomask(s) generated by mask fabrication 944 is used in a variety of processes. For example, such a mask(s) is used in an ion implantation process to form various doped regions in semiconductor wafer 953, in an etching process to form various etching regions in semiconductor wafer 953, and/or in other suitable processes.

Fab 950 includes wafer fabrication 952. Fab 950 is an IC fabrication business that includes one or more manufacturing facilities for the fabrication of a variety of different IC products. In some embodiments, Fab 950 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (BEOL fabrication), and a third manufacturing facility may provide other services for the foundry business.

Fab 950 uses photomask(s) 945 fabricated by mask house 930 to fabricate SOI IC 960. Thus, fab 950 at least indirectly uses design layout 922 to fabricate SOI IC 960. In some embodiments, SOI wafer 953 is fabricated by fab 950 using photomask(s) 945 to form SOI IC 960. In some embodiments, the device fabrication includes performing one or more photolithographic exposures based at least indirectly on design layout 922.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the active region extensions (or jogs) help in reducing intrinsic gate-to-gate distances while keeping extrinsic gate-to-gate distances large enough to avoid DRC violation in SOI IC design flow. Another advantage is that gate density in the SOI IC can be increased because of the reduced intrinsic gate-to-gate distances. Another advantage is that the signal delays and power consumptions in the SOI IC can be reduced by merging source/drain extensions of neighboring transistors. Another advantage is that routing resources of the M1 metal layer can be saved by merging source/drain extensions of neighboring transistors using the active region extensions.

In some embodiments, an IC structure includes a first transistor, a second transistor, an isolation region and a first gate extension. The first transistor includes a first gate extending along a first direction and first source/drain regions respectively on opposite sides of the first gate. The second transistor includes a second gate extending along the first direction and second source/drain regions respectively on opposite sides of the second gate. The isolation region is laterally between the first transistor and the second transistor. A first one of the first source/drain regions has a first source/drain extension protruding from a first boundary of the isolation region along a second direction substantially perpendicular to the first direction and away from the first gate, and a first one of the second source/drain regions has a second source/drain extension protruding from a second boundary of the isolation region along a third direction substantially perpendicular to the first direction and away from the second gate. The first gate extension extends from the first gate along the second direction to a position overlapping the isolation region.

In some embodiments, an IC structure includes a substrate, a first enclosed isolation region, a first gate structure and a second gate structure. The substrate includes a bottom semiconductor layer, an insulator layer over the bottom semiconductor layer and a top semiconductor layer over the insulator layer. The first enclosed isolation region is formed in the top semiconductor layer from a cross-sectional view and enclosed within a first active region of the top semiconductor layer from a top view. The first gate structure is on a first side of the first enclosed isolation region and forms a first transistor with the first active region. The second gate structure is on a second side of the first enclosed isolation region opposite the first side of the first enclosed isolation region. The second gate structure forms a second transistor with the first active region, wherein a source/drain region of the first transistor is merged with a source/drain region of the second transistor, and the merged source/drain regions of the first and second transistors define a lower boundary of the first enclosed isolation region from the top view.

In some embodiments, a method includes forming an isolation region in a substrate to define an active region in the substrate, wherein from a top view the isolation region has an outside isolation region surrounding the active region and an inside isolation region surrounded at least in part by the active region, and the active region has a first jog protruding from a first side of the inside isolation region toward a second side of the inside isolation region opposite the first side of the inside isolation region, and a second jog protruding from the second side of the inside isolation region toward the first side of the inside isolation region; forming a first gate structure over the active region, wherein from the top view the first gate structure comprises a first portion extending substantially parallel with the first side of the inside isolation region, and a second portion extending past the first side of the inside isolation region; and doping the active region to form first source/drain regions respectively on opposite sides of the first portion of the first gate structure, wherein a part of the first source/drain regions is formed on the first jog of the active region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) structure, comprising:
a first gate having a first portion extending along a first direction and a second portion extending along a second direction different from the first direction;
first source/drain regions respectively on opposite sides of the first portion of the first gate;
a second gate having a first portion extending along the first direction and a second portion extending along the second direction;
second source/drain regions respectively on opposite sides of the first portion of the second gate; and
an isolation region spacing the first source/drain regions apart from the second source/drain regions, wherein from a top view the isolation region has a lower portion between a first one of the first source/drain regions and a first one of the second source/drain regions, and an upper portion partially overlapping with the second portion of first gate and the second portion of the second gate, and wherein a width of the lower portion is a less than a width of the upper portion.

2. The IC structure of claim 1, wherein the second portion of the first gate is separated from the second portion of the second gate by a distance greater than the width of the lower portion of the isolation region.

3. The IC structure of claim 1, wherein the first gate has an L-shaped pattern from the top view.

4. The IC structure of claim 3, wherein the second gate has an L-shaped pattern from the top view.

5. The IC structure of claim 1, further comprising:
a first contact on one of the first source/drain regions; and
a second contact on one of the second source/drain regions, wherein the first and second contacts are laterally between the first portion of the first gate and the first portion of the second gate from the top view.

6. The IC structure of claim 5, further comprising:
a metal line extending across the first and second contacts, wherein a length of the metal line is shorter than a distance between the first portion of the first gate and the first portion of the second gate.

7. The IC structure of claim 6, wherein the length of the metal line is longer than a distance between the second portion of the first gate and the second portion of the second gate.

8. The IC structure of claim 6, wherein the length of the metal line is longer than the width of the upper portion of the isolation region.

9. An integrated circuit (IC) structure, comprising:
a first transistor comprising a first gate and first source/drain regions on opposite sides of the first gate;
a second transistor comprising a second gate and second source/drain regions on opposite sides of the second gate; and
an isolation region between the first transistor and the second transistor, wherein from a top view the isolation region has a first portion bordering a vertical side of a first one of the first source/drain regions and a vertical side of a first one of the second source/drain regions, and a second portion bordering a horizontal side of the first one of the first source/drain regions and a horizontal side of the first one of the second source/drain regions.

10. The IC structure of claim 9, wherein from the top view the first portion of the isolation region is narrower than the second portion of the isolation region.

11. The IC structure of claim 9, wherein from the top view the first gate has an L-shaped profile.

12. The IC structure of claim 11, wherein from the top view the second gate has an L-shaped profile symmetric to the L-shaped profile of the first gate.

13. The IC structure of claim 9, wherein a minimal distance between the first gate and the second gate is smaller than a width of the second portion of the isolation region.

14. The IC structure of claim 9, wherein the first portion and the second portion of the isolation region are spaced apart from a second one of the first source/drain regions and a second one of the second source/drain regions.

15. An IC structure, comprising:
a first transistor comprising a first gate and first source/drain regions on opposite sides of the first gate;
a second transistor comprising a second gate and second source/drain regions on opposite sides of the second gate; and
an isolation structure between the first transistor and the second transistor, wherein the isolation structure comprises:
a first top-view profile having a first side and a second side opposing the first side; and
a second top-view profile having a third side and a fourth side opposing the third side, wherein a width between the first side and the second side is smaller than a width between the third side and the fourth side.

16. The IC structure of claim 15, wherein a smallest distance between the first gate and the second gate is smaller than the width between the third side and the fourth side of the second top-view profile of the isolation structure.

17. The IC structure of claim 15, wherein a smallest distance between the first gate and the second gate is larger than the width between the first side and the second side of the first top-view profile of the isolation structure.

18. The IC structure of claim 15, wherein the first top-view profile of the isolation structure is between the first source/drain regions and the second source/drain regions.

19. The IC structure of claim 15, wherein the second top-view profile of the isolation structure overlaps the first gate.

20. The IC structure of claim 19, wherein the second top-view profile of the isolation structure overlaps the second gate.

\* \* \* \* \*